(12) United States Patent
Breyta et al.

(10) Patent No.: US 7,781,157 B2
(45) Date of Patent: Aug. 24, 2010

(54) METHOD FOR USING COMPOSITIONS CONTAINING FLUOROCARBINOLS IN LITHOGRAPHIC PROCESSES

(75) Inventors: Gregory Breyta, San Jose, CA (US); Daniel Paul Sanders, San Jose, CA (US); Hoa D. Truong, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 11/495,038

(22) Filed: Jul. 28, 2006

(65) Prior Publication Data

US 2008/0026317 A1    Jan. 31, 2008

(51) Int. Cl.
*G03F 7/38* (2006.01)
*G03F 7/11* (2006.01)

(52) U.S. Cl. .............. 430/325; 430/326; 430/273.1; 430/330; 430/327; 430/396; 430/270.1

(58) Field of Classification Search .......... None
See application file for complete search history.

(56) References Cited

U.S. PATENT DOCUMENTS

| 7,011,923 | B2 | 10/2005 | Li et al. | |
|---|---|---|---|---|
| 2003/0078352 | A1* | 4/2003 | Miyazawa et al. | ......... 526/245 |
| 2003/0215742 | A1 | 11/2003 | Barclay et al. | |
| 2003/0224283 | A1 | 12/2003 | Allen et al. | |
| 2004/0253542 | A1 | 12/2004 | Rushkin et al. | |
| 2005/0037289 | A1 | 2/2005 | Carr et al. | |
| 2005/0124827 | A1 | 6/2005 | Breyta et al. | |
| 2005/0124828 | A1 | 6/2005 | Breyta et al. | |
| 2005/0202347 | A1* | 9/2005 | Houlihan et al. | ............ 430/311 |
| 2005/0250898 | A1* | 11/2005 | Maeda et al. | ............... 524/544 |
| 2007/0003867 | A1* | 1/2007 | Hatakeyama et al. | .... 430/270.1 |
| 2008/0085466 | A1* | 4/2008 | Harada et al. | ............ 430/270.1 |

FOREIGN PATENT DOCUMENTS

| JP | 2004069921 A | 3/2004 |
|---|---|---|
| JP | 2004069981 A | 3/2004 |
| JP | 2005004159 A | 1/2005 |
| JP | 2005099276 A | 4/2005 |
| JP | 2005132827 A | 5/2005 |

OTHER PUBLICATIONS

Sanders et al Proc. SPIE Vo. 6519, 651904 (Apr. 2, 2007) (12 pages) no notation to page numbers in volume were given in citation.*

* cited by examiner

*Primary Examiner*—Cynthia Hamilton
(74) *Attorney, Agent, or Firm*—Robert Martin; Karen Canaan

(57) ABSTRACT

The present invention involves a method for generating a photoresist image on a substrate. The method comprises coating a substrate with a film comprising a polymer comprising fluorocarbinol monomers; imagewise exposing the film to radiation; heating the film to a temperature of, at, or below about 90° C. and developing the image. The present invention also relates to a method for generating a photoresist image on a substrate where a polymer comprising fluorocarbinol monomers is used as a protective top coat.

8 Claims, 14 Drawing Sheets

170 nm 1:1 L/S 180 nm 1:1 L/S

METHOD FOR USING COMPOSITIONS CONTAINING FLUOROCARBINOLS IN LITHOGRAPHIC PROCESSES

FIELD OF THE INVENTION

The present invention relates generally to the field of lithography and semiconductor fabrication. More specifically, the invention relates to materials with acid-labile tertiary ester groups containing fluorocarbinols in lithographic photoresist processes.

BACKGROUND OF THE INVENTION

Patterning of radiation sensitive polymeric films (referred to as photoresists) using photons, electrons, or ion beams is a critical step in the manufacture of semiconductor devices. The incident radiation includes commonly used wavelengths of 436, 365, 257, 248, 193 and 157 nanometers, 'soft' x-ray (so-called extreme ultraviolet (EUV), 13.5 nm) and x-ray radiation, and beams of ions or electrons. Patterns are defined by irradiation through a patterned mask (in the case of optical, EUV, x-ray, and projection electron beam lithography) or via a direct write process in the case of electron or ion beam lithography. The incident radiation induces a chemical change in the photoresist film which causes a physical (e.g., molecular weight or thermal stability) or chemical (solubility) property of the exposed material to differ from that of material in the unexposed regions. Subsequent development processes can selectively remove the material in either the exposed or unexposed region. Typically, this involves rinsing the exposed silicon wafer with a developer such as aqueous tetramethylammonium hydroxide.

Photoresists are generally formulated to contain a matrix polymer, a radiation sensitive compound/functionality, and performance modifiers (e.g., dissolution inhibitors and bases quenchers) in a solvent suitable for spin-casting. While early photoresists relied on direct interaction of incident radiation with the radiation sensitive compound/functionality, the low quantum efficiency of this approach is unsuitable for high resolution imaging in which high sensitivity to low doses of radiation is required. Subsequently, "chemically-amplified" resists have been developed in which the incident radiation interacts with a radiation sensitive compound/functionality to produce a species capable of performing a catalytic reaction on a large number of functional groups to induce a large property change from a low exposure dose. Typically, chemically-amplified resists are designed with a compound, referred to as a photoacid generator (PAG), which produces a strong acid when exposed to radiation of the appropriate wavelength. This strong acid catalyzes chemical reactions such as the deprotection of acid-labile protecting groups (typically positive tone photoresists) or the polymerization of acid-sensitive groups such as epoxides or the reaction of polymer-bound functionalities with crosslinking agents (negative-tone photoresists). In this manner the quantum efficiency of the overall process can approach or even exceed a value of one. The particular chemical structures of the functional groups attached to the matrix polymer is particularly important since it, typically, defines the tone (positive or negative) and imaging performance of the photoresist.

In practice, many properties of the photoresist and its components determine its imaging performance. The non-radiation sensitive components of the formulation must be relatively transparent (particularly with optical lithography) to avoid non-productive attenuation of the incident radiation. In optical lithography, the ultimate achievable resolution is a function of the wavelength of the incident radiation according to the Rayleigh equation:

$$R = k_1 \lambda / NA \tag{1}$$

where $\lambda$ is the wavelength of the incident radiation, NA is the numerical aperture of the lens system, and $k_1$ is a process-dependent factor typically between 0.5 and 0.25. In order to achieve smaller feature sizes, industry has traditionally moved to shorter wavelengths of light, often requiring redesign of photoresists to accommodate the new radiation wavelength. For example, photoresist polymers based on 4-hydroxystyrene and its copolymers are widely used with 248 nm radiation due to their high resistance to etch processes and high transparency; however, these aromatic polymers are not useful for imaging with 193 nm radiation due to their heavy absorbance. Subsequently, new photoresists based on acrylate, methacrylate, or cyclic olefin polymers were developed which are transparent at 193 nm. Carbon-rich, alicyclic groups have been particularly featured due to their good transparency and high etch resistance.

In order to achieve even smaller features using the same incident radiation source, immersion lithography has been developed in which a medium with a refractive index greater than air (or vacuum) is placed between the final lens element and the photoresist. Most commonly, this involves the use of water in 193 nm immersion lithography; however, higher index aqueous and organic fluids have been demonstrated for 193 nm and 157 nm immersion lithography. The chemistry of the photoresist must be tailored such that the photoresist does not dissolve or swell in the immersion medium. Sometimes a sacrificial protective topcoat film is deposited on top of the photoresist to prevent leaching of photoresist components (e.g., PAG, quencher, matrix resin) into the immersion medium. The topcoat also controls the surface energy of the film stack, controlling the contact angle of the immersion fluid in contact with the surface. High fluid contact angles have been shown to facilitate rapid scanning of the immersion lens across the wafer surface without leaving residual droplets of fluid behind, which can lead to defects. The chemistry and the topcoat material are matched to afford good compatibility and imaging performance.

Since the dimensions of image features and characteristics such as line edge roughness (or line width variation) are of the same order as the radius of gyration of typical polymeric photoresist matrix resins, new architectural variants of the polymeric matrix resins have been developed including branched and hyper-branched polymers and oligomers. In the extreme case, functionalized-monomeric compounds (so-called "molecular resists" or "molecular glasses") based on well-defined compounds such as cyclodextrins, polyhedral oligomeric silsesquioxanes, or adamantane have been functionalized and implemented in photoresist compositions.

Unfortunately, changes in the chemistry of photoresist materials affect not only the transparency of the photoresist but its dissolution behavior during development. Poly(4-hydroxystyrene)-based 248 nm photoresists dissolve uniformly in industry standard 0.262 N tetramethylammonium hydroxide developer with no swelling at the onset of dissolution. Further modification of the dissolution behavior is possible through the use of protecting/crosslinking groups and dissolution inhibitors. However, typical acrylate, methacrylate, and cyclic olefin photoresists used with 193 nm radiation swell during the initial stages of development, affording non-uniform dissolution. Photoresists based on fluoroalcohols have been developed for 157 nm and 193 nm imaging. The inductive stabilization of the conjugate base of these alcohols by the heavily electron-withdrawing groups can result in a pKa similar to that of phenol and can render these functional groups soluble in aqueous base. Fluoroalcohol based resists have been shown to offer linear dissolution behavior with little swelling.

Another possible approach to improve the ultimate resolution of photoresists is to bake them at low temperatures after exposure. In this manner, the diffusion of the photoacid can be limited and can result in lower image blur. This approach necessitates the use of a protecting group with a low activation energy for acid-catalyzed deprotection. It has also been shown in the literature that the rate of acid-catalyzed reactions in the photoresist is heavily affected by the polarity of the medium (i.e., higher polarity media facilitates more rapid reactions at lower temperatures and lower polarity media requires higher temperatures to achieve similar reaction rates). Unfortunately, many of the common acid-labile protecting groups are simple hydrocarbons which reduce the overall polarity of the photoresist film and raise the required post-exposure bake temperatures and increase image blur.

Photoresists based on fluoroalcohols have been developed for 157 nm and 193 nm imaging have been described in the patent literature. A class of tertiary acrylate esters containing fluoroalcohol groups has been reported in JP 2005132827. However, the presence of heavily electron-withdrawing fluorinated groups adjacent to the ester in these compounds will hinder the formation of the intermediate carbocation during deprotection to significantly limit the cleavage of the protecting group under acid catalysis and substantially interfere with the performance of the resist. Several types of tertiary acrylate esters and acetals containing fluoroalcohol groups have been described in JP 2005099276, US 2005026074, JP 2005004159, JP 2004069981, and JP 2004069921. These monomers generally have multiple fluoroalcohol groups which will impart very high solubility (and dark loss) to the resist. Acetal-based protecting groups require water to be present for the deprotection reaction and therefore are disfavored in the industry. Several other monomers require long, inefficient syntheses employing oxidation/reduction sequences and/or rely on non-commercially available starting materials. There is a need for lithographic methods using improved photoresists which can be synthesized on a commercial scale with commercially available materials to provide enhanced lithographic performance.

SUMMARY OF INVENTION

The present invention comprises a method for generating a photoresist image on a substrate. The method involves first coating the substrate with a photoresist film comprising a macromolecule or a polymer comprising a monomer. The macromolecule and the monomer each have the formula:

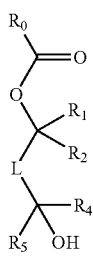

where $R_0$ is selected from a molecular glass, $C_{2-20}$ alkylenyl and fluorinated alkylenyl, and $C_{4-40}$ cycloalkylenyl and fluorinated cycloalkylenyl, each optionally substituted with one or more heteroatoms;

$R_1$ and $R_2$ are independently selected from $C_{1-20}$ alkyl and further $R_1$ and $R_2$ can be bonded together to form a cyclic group;

L is a divalent $C_{1-20}$ alkyleneyl or cycloalkyleneyl optionally substituted with $C_{1-20}$ alkyl and fluoroalkyl and $C_{4-30}$ cycloalkyl optionally substituted with a substituent selected from one or more hydroxyl, fluoro and heteroatom substituents;

$R_4$ is selected from hydrido, trifluoromethyl, difluoromethyl, fluoromethyl, $C_{1-20}$ alkyl and $C_{4-20}$ cycloalkyl each optionally substituted with one or more fluoro substituents; and $R_5$ is selected from trifluoromethyl, difluoromethyl, fluoromethyl, $C_{1-20}$ alkyl and $C_{4-20}$ cycloalkyl each substituted with one or more fluoro substituents and further $R_4$ and $R_5$ can be linked to form a cyclic group.

After the film has been coated onto the substrate, the film is imagewise exposed to radiation. The film is then heated film to a temperature at or below about 90° C. The image is then developed to the substrate using art known techniques.

In one embodiment of the invention, there is provided a method for generating a photoresist image on a substrate comprising:

(a) coating the substrate with a photoresist film;
(b) coating the film with a protective macromolecule or a polymer comprising a monomer, each having the formula:

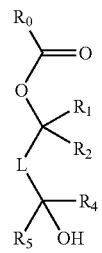

where $R_0$ is selected from a molecular glass, $C_{2-20}$ alkylenyl and fluorinated alkylenyl, and $C_{4-40}$ cycloalkylenyl and fluorinated cycloalkylenyl, each optionally substituted with one or more heteroatoms; $R_1$ and $R_2$ are independently selected from $C_{1-20}$ alkyl and further $R_1$ and $R_2$ can be bonded together to form a cyclic group; L is a divalent $C_{1-20}$ alkyleneyl optionally substituted with one more substituents selected from $C_{1-20}$ alkyl and fluoroalkyl and $C_{4-30}$ cycloalkyl optionally substituted with a substituent selected from one or more fluoro and heteroatom substituents; $R_4$ is selected from hydrido, trifluoromethyl, difluoromethyl, fluoromethyl, $C_{1-20}$ alkyl and $C_{4-20}$ cycloalkyl each optionally substituted with one or more fluoro substituents; and $R_5$ is selected from trifluoromethyl, difluoromethyl, fluoromethyl $C_{1-20}$ alkyl and $C_{4-20}$ cycloalkyl each substituted with one or more fluoro substituents and further $R_4$ and $R_5$ can be linked to form a cyclic group;

(c) imagewise exposing the film and polymer to radiation;
(d) heating the film and polymer to a temperature at or below about 90° C.; and
(e) developing the image to the substrate.

In a further embodiment, the film and polymer are heated to a temperature at or below 80° C.

In another embodiment of the invention, $R_0$ has the formula:

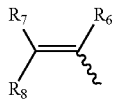

where $R_6$, $R_7$ and $R_8$ are independently select from hydrido, fluoro and $C_{1-4}$ alkyl.

In a further embodiment of the invention, $R_0$ has the formula:

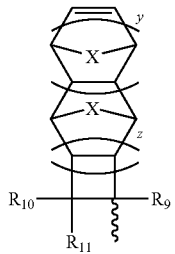

where $R_9$ is selected from hydrido, fluoro or $C_{1-20}$ alkyl optionally substituted with one or more fluoro substituents; $R_{10}$ and $R_{11}$ are independently selected from hydrido, fluoro and $C_{1-20}$ alkyl; each X is a divalent substituent independently selected from carbonyl, oxygen, sulfur, methylene, ethylene, $>C(R_{12})(R_{13})$, $>C=CHR_{12}$, $>C=C(R_{12})(R_{13},)$ and $>NR$ where R, $R_{12}$ and $R_{13}$ are independently selected from hydrido, fluoro and $C_{1-20}$ alkyl optionally substituted with fluoro and where $R_{12}$ and $R_{13}$ can be linked to form a cyclic group; and where y is 0 to 4 and where z is 0 or 1.

In a further embodiment, L is selected from propylene and —$CHR_{14}$—$CHR_{15}$—$CH_2$—$CH_2$— where $R_{14}$ and $R_{15}$ are independently selected from $C_{1-20}$ alkyl optionally substituted with one or more fluoro substituents and where $R_2$ and $R_{14}$ can be linked to form a cyclic group and where $R_{14}$ and $R_{15}$ can be linked to form a cyclic group.

In another embodiment, L is $>CHR_{16}$ and where $R_{16}$ is $C_{1-20}$ alkyl optionally substituted with one or more fluoro substituents and where $R_{16}$ can be linked with $R_2$ to form a cyclic group.

The polymer can optionally comprise other monomers which are desired to enhance performance. The film generally comprises a photoacid generator. The film can also comprise other desired additives such as other polymers, solvents, quenchers, dissolution inhibitors, dyes, surfactants and the like.

The method of the present invention can also be utilized in immersion lithography where a liquid having an index of refraction greater than about 1.40 is disposed on the film during the exposure of the film to radiation.

The present invention also relates to the use of the polymer of the invention as an additive to a resist formulation and also as a protective top coat film over a photoresist film during a lithographic process.

DETAILED DESCRIPTION

Figure 1:
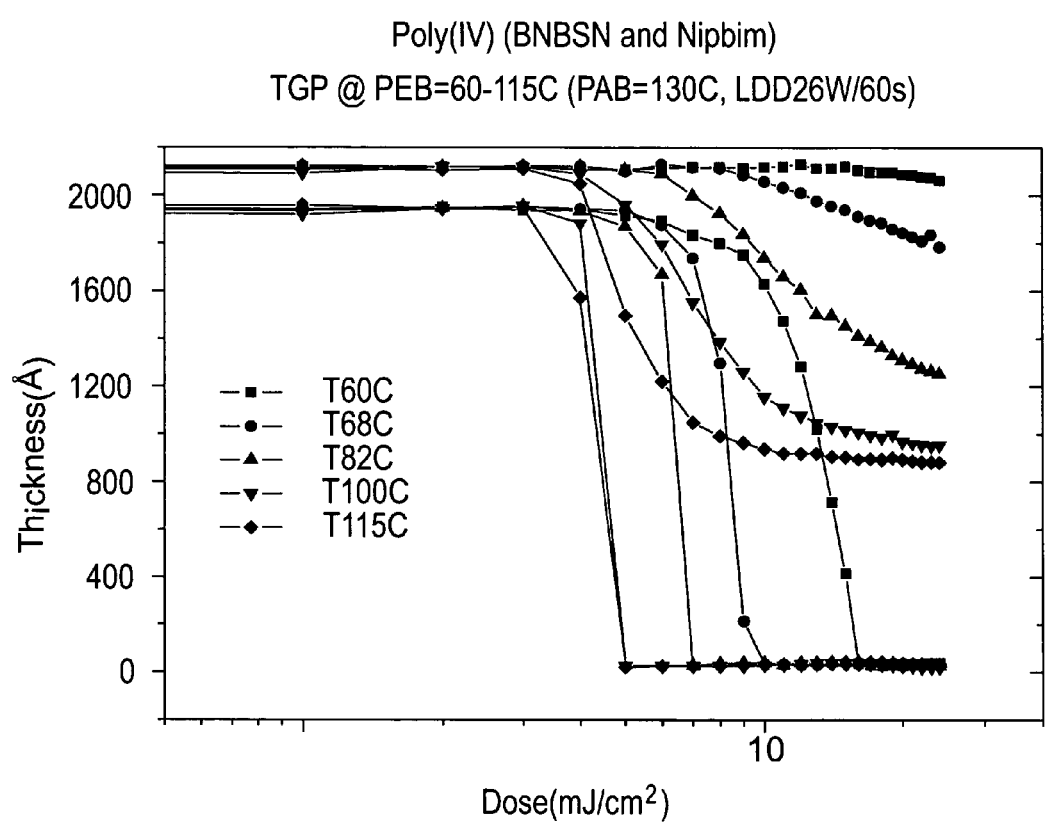
FIG. 1 is a contrast curve for photoresist polymers used in the present invention.

The present invention involves a method for generating a photoresist image on a substrate. The method comprises (a) coating a substrate with a film comprising a macromolecule or a polymer comprising monomers of the present invention; (b) imagewise exposing the film to radiation; (c) heating the film to a temperature at or below about 90° C.; and (d) developing the image.

The method involves first coating the substrate with a photoresist film. In one embodiment, the film comprises a polymer comprising a monomer. The monomer has the formula shown above in the summary of the invention. In one embodiment of the invention, $R_0$ of the monomer has the formula:

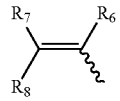

where $R_6$, $R_7$ and $R_8$ are independently select from hydrido, fluoro and $C_{1-5}$ alkyl, however, preferably only one substituent is alkyl. In another embodiment, $R_0$ has the formula:

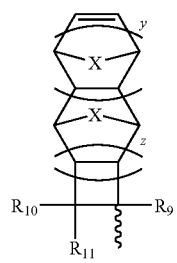

where $R_9$ is selected from hydrido, fluoro or $C_{1-20}$ alkyl optionally substituted with one or more fluoro substituents;

$R_{10}$ and $R_{11}$ are independently selected from hydrido, fluoro and $C_{1-20}$ alkyl;

each X represents a divalent substituent independently selected from carbonyl, oxygen, sulfur, methylene, ethylene, $>C(R_{12})(R_{13})$, $>C=CHR_{12}$, $>C=C(R_{12})(R_{13})$ and $>NR$ where R, $R_{12}$ and $R_{13}$ are independently selected from hydrido, fluoro and $C_{1-20}$ alkyl optionally substituted with one or more fluoro substituents and where $R_{12}$ and $R_{13}$ can be linked to form a cyclic group; and where y is 0 to 4 and where z is 0 or 1.

In still another embodiment, $R_0$ is selected from a molecular glass. A molecular glass is a nonolymeric macromolecule having a molecular weight of greater than 500 daltons which forms an amorphous glassy film at room temperature. The molecular glass preferably has a glass transition temperature greater than about 75° C. Suitable molecular glass substituents include functionalized or non-functionalized compounds such as adamantane, norbornene, cyclodextrin, calzarene, resorcinarene, pyrogallolarene or a silicon cage compounds such as POSS. The macromolecule comprising a fluorocarbinol substituted molecular glass provides a suitable molecular glass resist for use in the present invention.

In another embodiment of the invention, L is selected from divalent propylene and $-CHR_{14}-CHR_{15}-CH_2-CH_2-$. In the later example, the monomer has the formula:

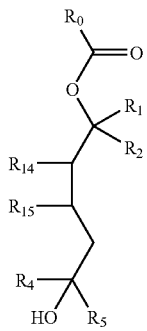

where $R_{14}$ and $R_{15}$ are independently selected from hydrido and $C_{1-20}$ alkyl optionally substituted with one or more fluoro substituents, provided that $R_2$ can be linked with either or both $R_{14}$ and $R_{15}$ to form a cyclic group and that $R_{14}$ and $R_{15}$ can be linked to form a cyclic group.

In the present invention, suitable unsubstituted or substituted cyclic (including polycyclic) substituents are comprised of 1 to 5 joined rings; and examples of substituents include, but are not limited to:

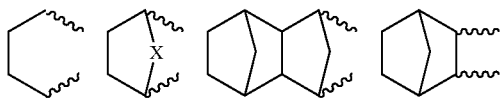

where X represents methylene ($CH_2$), ethylene ($CH_2CH_2$), substituted methylene ($C(R_{29})(R_{30})$, $C=CHR_{29}$, or $C=C(R_{29})(R_{30})$) where $R_{29}$ and $R_{30}$ are selected from hydrido, fluoro and a linear or branched alkyleneyl group of 1 to 20 carbons, or a semi- or perfluorinated linear or branched alkyl group of 1 to 20 carbons), carbonyl (CO), oxygen (O), sulfur (S), and aliphatic amine (NR); and where $R_{29}$ and $R_{30}$ can be taken together to form a fused cyclic aliphatic group of 1 to 20 carbons.

In another embodiment, L is $>CHR_{16}$ and the monomer has the formula:

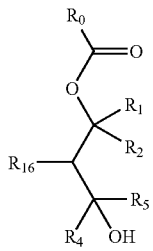

where $R_{16}$ is $C_{1-20}$ alkyl optionally substituted with one or more fluoro substituents and where $R_{16}$ and $R_2$ can be linked to form a cyclic group.

In another embodiment, the monomer only has fluoro substituents on $R_4$ and $R_5$ and optionally at least 3 fluoro substituents. Suitably, the polymer has a molecular weight of about 1000 to 100,000 daltons and preferably about 5000 to about 30,000 daltons.

The term "alkyl" as used herein refers to a branched or unbranched saturated hydrocarbon substituent. The term "cyclic" and "cyclo" shall refer to cyclic non-aromatic compounds, substituents or linkages and shall include polycyclic compounds and substituents and linkages including bicyclic. The term "cycloalkyl" as used herein refers to a hydrocarbon substituent whose structure is characterized by a closed ring and shall include compounds which also have one or more mono or divalent alkyl groups attached to the closed ring. The term "alkoxy" as used herein refers to a substituent —O—R where R is an alkyl group. The term "alkylenyl" as used herein refers to a branched or unbranched unsaturated hydrocarbon substituent having at least one double bond (such as R—HC=CH—R—; $H_2C$=CH—R—; and R—HC=CH— where R is alkyl). The term "alkyleneyl" as used herein refers to a divalent alkyl group. The term "heteroatom" as used herein shall mean a divalent atom selected from nitrogen, oxygen or sulfur positioned within an alkyl group (such as —$CH_2$—NH—$CH_2$—). The term polymer as used herein shall mean a large molecule made up of simple repeating units (monomers) and shall include oligomers (low molecular weight polymers) and cage silicon compounds suitable as molecular glass resists.

Suitably, in the method of the present invention, the photoresist film also comprises a photo or thermal acid generator. The photoacid generator may be any compound that, upon exposure to radiation, generates a strong acid and is compatible with the other components of the photoresist composition. Any suitable photoacid generator can be used in the photoresist compositions of the invention. Examples of suitable PAGs include, but are not limited to, sulfonates, onium salts, aromatic diazonium salts, sulfonium salts, diaryliodonium salts and sulfonic acid esters of N-hydroxyamides or N-hydroxyimides, as disclosed in U.S. Pat. No. 4,731,605. Suitably, the PAG should have high thermal stability (i.e., be stable to at least 120 C) so they are not degraded during the exposure process.

The first step of the present invention involves suitably coating a substrate with a film of the present invention dissolved in a suitable solvent. Suitable substrates include, for example, silicon dioxide, silicon nitride and silicon oxynitride. Suitable solvents include cyclohexanone, ethyl acetate and propylene glycol methyl ether acetate. The film can be coated on the substrate using art known techniques such a spray or spin coating or doctor blading. Suitably, before the film is exposed to radiation, the film is heated to an elevated temperature of about 90 to 150° C. for a short period of time to remove excess solvent. The dried film suitably has a thickness of about 0.1 to 5.0 microns.

The film is then imagewise exposed to an energy flux of radiation of x-ray, electron beam or ultraviolet. Suitable radiation has a wavelength of less than 206 nm, and preferably less than 200 nm (e.g., 193 nm). Suitable radiation sources are ArF excimer and KrF excimer lasers. Conveniently, due to the enhanced sensitivity of the resist film, a resist film of 1 micron thickness is fully exposed with less than about 50 mJ/cm$^2$ and preferably less than about 30 mJ/cm$^2$. The radiation is absorbed by the resist composition and suitably a radiation sensitive acid generator to generate free acid.

After exposure to radiation, the film is again heated to a low temperature of about 90° C. or less or at or below 90° C. for a short period time of about 1-2 minute(s) to cause cleavage of the acid cleavable ester substituent in the exposed portion of the resist composition with subsequent formation of the corresponding acid. Because this reaction can be processed at this lower temperature, there is substantially less diffusion of the photogenerated acid into unexposed areas of the film. This reaction proceeds at this low temperature due to the lower activation energy of the acid cleavable monomer in the inventive process. In another embodiment, the film is heated to a temperature of about 80° C. or less, or at or below 80° C. In still another embodiment, the film is heated to a temperature of about 75° C. or less, or at or below 75° C.

After heating, the resist image is developed in the film by art known techniques such as aqueous development. Suitably, the film is exposed to a solvent, suitably an aqueous base such as tetramethyl ammonium hydroxide. The solvent removes the portions of the film which were exposed to radiation to expose the underlying substrate. After the substrate has been exposed, circuit patterns can be formed on the substrate by coating the substrate with a conductive metal by art-known techniques.

The method of the present invention can also be used in immersion lithography where a thin film of liquid is disposed between the photoresist film and the source of the radiation during the process of exposing the film to radiation. This can be suitably done by flowing the liquid over the film during the exposure step or alternatively, immersing the film in the liquid during the exposure step. Suitable liquids have an index of refraction of about 1.40 or more and have suitable properties for immersion lithography such as high transparency and low viscosity. Suitable liquids include water, cyclooctane, cyclononane, cyclodecane, decahydronaphthalene, hydrindane, bicyclohexyl, ethylnorbornane, and tricyclo(5.2.1$^{1,}$ $_{7}$.0$^{2,6}$)decane (tetrahydrodicyclopentadiene).

The present invention also relates to method for the use of the polymer of the present invention as a top coat over a photoresist film in the process of forming an image on the substrate. In the method, after the photoresist film has been disposed on the substrate, the material of the present invention is coated onto the photoresist film. The top coat of the material protects the photoresist film during processing (e.g., from swelling and leaching of resist components such as PAGs into the immersion fluid. The material also controls the surface energy and thereby the contact angle formed by the immersion fluid with the surface. After the image has been formed on the substrate, the top coat can be removed by art known techniques.

Suitably, the photoresist film used in the method of the present invention may be blended with one or more additional polymers, oligomers, or molecules (which may by themselves function as photoresists) to afford properties desirable in a photoresist such as thermal or mechanical properties, dissolution properties, and etch resistance.

The present invention also relates to the use of the material of the present invention as an additive which is blended into a resist formulation and which enriches or populates the resist surface (air interface) during film formation to form a protective layer in situ. The material forming this protective layer may control the resist surface (surface energy, contact angles with immersion fluids, etc.) and/or control PAG (or other resist component) leaching into the immersion fluid and/or afford the resist greater protection to environmental contaminants.

In addition, the photoresist film can further include one or more additional components including, but not limited to, a solvent, crosslinking agent, surfactant, basic compound, dissolution inhibitor, dissolution accelerator, adhesion promoter, defoaming agent, and other additives useful in providing desired properties.

The materials used in the present invention with the fluoroalcohol group have a pKa such that they can be dissolved in typical aqueous developer solution. However, in this invention their base-solubility is not intended to directly lead to dissolution of the photoresist film as this would increase dark loss. Instead, monomers and macromolecules with only one fluoroalcohol group which are not readily soluble in basic developer are preferred in this invention. The fluoroalcohol group plays several roles. Primarily, the unique dissolution properties of the fluoroalcohol group (no/low initial swelling during development and strong interactions with dissolution inhibitors) will control the dissolution rate of the resist and boost image contrast. Secondarily, the fluoroalcohol group will increase the polarity of the reaction medium to accelerate acid catalysis at lower temperature. Thirdly, the fluorinated groups will influence the surface energy of the resist and may offer higher contact angles with immersion fluids such as water. Finally, the addition of heavy fluoroalcohol groups may help prevent volatilization (e.g., outgassing) of the cleaved protecting group during exposure, limiting contamination of optical elements. Placement of the fluoroalcohol group on the protection group changes the solubility switch monomer into a multiple function component. This potentially affords the ability to use fewer monomers in copolymerization to achieve the same photoresist properties, lowering the complexity of the polymerization and lowering cost. It can also afford the possibility of replacing or reducing the content of another fluoroalcohol-containing monomer in a resist polymer with, for example, less expensive monomers or monomers that influence other resist properties. The photoresist compositions of this invention take advantage of the superior dissolution characteristics as well as their high polarity to afford high photospeed, rapid uniform dissolution, and excellent profiles. These monomers with fluoroalcohol-functionalized protecting groups are accessible from commercially available materials in a more efficient manner than many of the prior art compounds. In addition, these monomers contain a moderate carbon to fluoroalcohol ratio to ensure that background dissolution of the resist is low.

The acrylate and methacrylate-based monomers used in the method of the present invention and their corresponding polymers possess several advantages over conventional materials. These monomers readily undergo free-radical homopolymerization and free-radical copolymerization with a variety of other comonomers. These metal-free polymerizations are tolerant of many functionalities, are rapid and inexpensive, and provide good control over the molecular weight and polydispersity (especially if a chain transfer agent is used). These monomers are also amenable to living or controlled free-radical polymerization processes such as nitroxide-mediated living radical polymerization, atom-transfer radical polymerization (ATRP), group transfer polymerization, reversible addition-fragmentation chain transfer (RAFT) and related techniques to provide control over molecular weight, polydispersity, and chain-end functionality. Acrylate and methacrylate polymers are generally soluble in conventional casting solvents and readily form uniform films when cast onto conventional substrates.

The cyclic olefin-based monomers used in the method of the present invention may be readily polymerized via free radical techniques only when copolymerized with electron-deficient comonomers such as maleic anhydride or tetrafluoroethylene among others. Alternatively, metal-catalyzed polymerizations such as ring-opening metathesis polymerization or addition polymerization can be used to produce cyclic olefin homo- and copolymers. Norbornene-type polymers (especially addition polymers) typically have very high etch resistance compared to acrylate and methacrylate-based photoresist materials. Suitable synthesis of monomers used in method of the present invention is shown below.

EXAMPLE 1

Synthesis of 1,1,1-trifluoro-2-trifluoromethyl-2-hydroxy-6-methyl-hept-6-yl methacrylate (IV)

Preparation of E-methyl 6,6,6-trifluoro-5-hydroxy-5-(trifluoromethyl)hex-2-enoate (I):

To a nitrogen-flushed, 150 mL steel reaction vessel with teflon-coated magnetic stirbar was added 30.0 g methyl 3-buteneoate (300 mmol, 1 eq.). Hexafluoroacetone (55.8 g, 336 mmol, 1.1 eq.) was condensed into the vessel at −78° C. The reaction vessel was sealed under 1 atmosphere of nitrogen and warmed to room temperature slowly. The reaction was heated at 160° C. for 16 hours after which the pressure

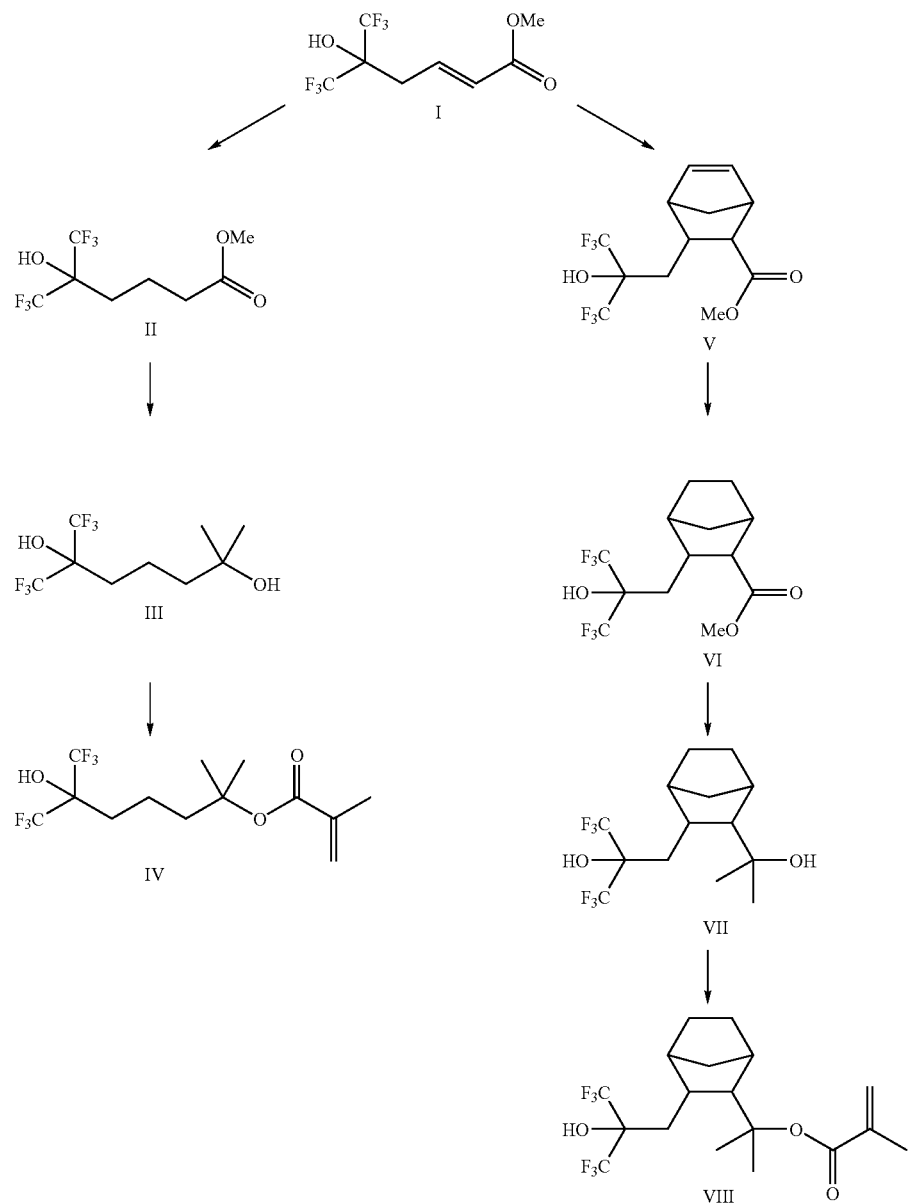

Scheme 1.
Synthesis of fluoroalcohol-functionalized protecting groups and methacrylate monomers.

had decreased dramatically. The vessel was cooled in an ice bath and the excess hexafluoroacetone was carefully vented through a saturated potassium hydroxide solution. The crude reaction mixture was vacuum distilled using a 6-inch, vacuum-jacketed vigereaux column with a short-path distillation head. The product was isolated at 75-80° C. (6 Torr) as a colorless liquid. A second distillation of the prefraction resulted in a total isolated yield of 55.4 g (69%) of E-methyl 6,6,6-trifluoro-5-hydroxy-5-(trifluoromethyl)hex-2-enoate (I).

Alternative preparation of E-methyl 6,6,6-trifluoro-5-hydroxy-5-(trifluoromethyl)hex-2-enoate (I):

To a 250 mL 3 neck roundbottom flask with reflux condenser and Teflon-coated magnetic stir bar was added methyl acrylate (9.10 g, 105.7 mmol, 1.1 eq.), 1,1,1-trifluoro-2-trifluoromethyl-pent-4-ene-2-ol (20 g, 96.1 mmol, 1 eq.) and 100 mL of anhydrous dichloromethane. The solution was heated to reflux under nitrogen and 300 mg of the Hoveyda-Grubbs $2^{nd}$ generation ruthenium metathesis catalyst (0.048 mmol, 0.005 eq.) was added in 4 portions over 4 hours. The reaction was heated an additional 12 hours after which the product was purified by vacuum distillation (65° C., 6 Torr) and column chromatography (silica gel, 80:20 hexane:ethyl acetate eluent) to afford 16.7 g of methyl 6,6,6-trifluoro-5-hydroxy-5-(trifluoromethyl)hex-2-enoate (I) as colorless liquid (E/Z=2.15:1) contaminated with a small amount (0.15 eq.) of 1,1,1,8,8,8-hexafluoro-2,7-di(trifluoromethyl)-oct-4-ene-2,7-diol (E/Z=6.7:1).

Preparation of methyl 6,6,6-trifluoro-5-hydroxy-5-(trifluoromethyl)hexanoate (II):

To a 330 mL thick-walled glass hydrogenation vessel was added 37.7 g E-methyl 6,6,6-trifluoro-5-hydroxy-5-(trifluoromethyl)hex-2-enoate (I) (141 mmol), 0.5 g palladium-on-carbon (5 wt % Pd), and 150 mL ethyl acetate. The reaction vessel was attached to a Parr hydrogenation apparatus and the reaction solution degassed via three successive pump-backfill cycles with nitrogen. The reaction vessel was pressurized to 40 psi with hydrogen and shaken at room temperature for 20 hours, after which the pressure had fallen to 34 psi. The excess hydrogen was removed via three successive pump-backfill cycles with nitrogen and the palladium catalyst removed via filtration through 1.0 micron glass fiber and 0.2 micron PTFE filters. The solvent was removed in vacuo and the crude reaction mixture distilled under vacuum (6 Torr, 64-74° C.) to afford 34.4 g (91%) of methyl 6,6,6-trifluoro-5-hydroxy-5-(trifluoromethyl)hexanoate (II) as a colorless liquid.

Preparation of 1,1,1-trifluoro-6-methyl-2-(trifluoromethyl)heptane-2,6-diol (III):

To a flame-dried, nitrogen-purged, 500 mL 3-neck roundbottom flask with 250 mL, pressure-equalized addition funnel and stirbar was added 129 mL of methyl magnesium bromide (388 mmol, 3.1 eq., 3 M in ethyl ether). A degassed solution of 33.5 g methyl 6,6,6-trifluoro-5-hydroxy-5-(trifluoromethyl)hexanoate (II) (125 mmol, 1 eq.) in 150 mL anhydrous tetrahydrofuran was charged to the addition funnel and added dropwise to the reaction over the course of 1 hour at room temperature. After 2 hours the large amount of precipitate necessitated the addition of 100 mL additional anhydrous tetrahydrofuran. The reaction was stirred at room temperature for 26 hours, after which it was cooled to 0° C. and carefully quenched with dilute hydrochloric acid solution until the pH was less than 5.0. The reaction solution was neutralized with saturated aqueous sodium bicarbonate until the pH was greater than 8. The product was extracted into ethyl ether and the organic phase washed with brine and dried over magnesium sulfate, filtered, concentrated in vacuo, and stored over a small amount of sodium bicarbonate. Only one product was observed by $^{19}$F NMR and the crude product (48.9 g) was carried on without further purification.

Preparation of 1,1,1-trifluoro-2-trifluoromethyl-2-hydroxy-6-methyl-hept-6-yl methacrylate (IV):

To a flame-dried, nitrogen-purged 500 mL 3-neck roundbottom flask with 250 mL pressure-equalizing addition funnel and magnetic stirbar was charged 156 mL n-butyl lithium (250 mmol, 2 equiv., 1.6 M in hexanes). A degassed solution of 1,1,1-trifluoro-6-methyl-2-(trifluoromethyl)heptane-2,6-diol (III) (~125 mmol, 1 eq.) in 100 mL anhydrous tetrahydrofuran was charged to the addition funnel and added to the reaction mixture dropwise at 0° C. over 30 minutes. The reaction mixture was warmed for 15 minutes on a hot water bath to ensure the reaction was complete. The reaction vessel was cooled to 0° C. and 14.4 g methacryloyl chloride (138 mmol, 1.1 eq.) was added dropwise and allowed to stir for 15 minutes. The addition funnel was replaced with a reflux condenser and the reaction heated to reflux for 20 hours. After the reaction was complete, it was cooled to 0° C. and quenched with dilute HCl solution until the pH was less than 5.0. The reaction solution was neutralized with saturated aqueous sodium bicarbonate until the pH was greater than 8. The product was extracted into ethyl ether and the organic phase washed sequentially with aqueous sodium bicarbonate, water, and brine and then dried over magnesium sulfate, filtered, concentrated in vacuo, and stored over a small amount of sodium bicarbonate. The crude product mixture was purified via silica gel column chromatography (20:1 hexane:ethyl acetate eluent) to afford 14.7 g (35%) of 1,1,1-trifluoro-2-trifluoromethyl-2-hydroxy-6-methyl-hept-6-yl methacrylate (IV) as a colorless liquid.

EXAMPLE 2

Synthesis of 1,1,1,3,3,3-hexafluoro-2-((3-(2-hydroxypropan-2-yl)bicyclo[2.2.1]heptan-2-yl) methyl) propan-2-yl methacrylate (VIII)

Preparation of methyl 3-(3,3,3-trifluoro-2-hydroxy-2-(trifluoromethyl)propyl)bicyclo[2.2.1]hept-5-ene-2-carboxylate (V):

To a 40 mL thick-walled glass pressure tube with Teflon-coated magnetic stirbar was added 13.5 g E-methyl 6,6,6-trifluoro-5-hydroxy-5-(trifluoromethyl)hex-2-enoate (I) (50.7 mmol, 1 eq.) and 86.2 g freshly cracked dicyclopentadiene (86.2 mmol, 1.7 eq.). The vessel was sealed under slight vacuum and heated on an oil bath at 150° C. for 19 hours after which NMR spectroscopy showed only ~2% of starting material remaining and 80% conversion to product and 17% conversion to higher cyclopentadiene adducts. The crude reaction mixture was distilled under vacuum using a short-path distillation apparatus (115° C., 6 Torr) to afford 12.5 g (74%) as a clear liquid (mixture of isomers, 1:1 ratio).

Preparation of methyl 3-(3,3,3-trifluoro-2-hydroxy-2-(trifluoromethyl)propyl)bicyclo[2.2.1]heptane-2-carboxylate (VI):

To a 330 mL thick-walled glass hydrogenation vessel was added 12.5 g methyl 3-(3,3,3-trifluoro-2-hydroxy-2-(trifluoromethyl)propyl)bicyclo[2.2.1]hept-5-ene-2-carboxylate (V) (37.6 mmol), 0.5 g palladium-on-carbon (5 wt % Pd), and 100 mL methanol. The reaction vessel was attached to a Parr hydrogenation apparatus and the reaction solution degassed via three successive pump-backfill cycles with nitrogen. The reaction vessel was pressurized to 40 psi with hydrogen and shaken at room temperature for 20 hours, after which the pressure had fallen to 34 psi. The excess hydrogen was removed via three successive pump-backfill cycles with nitrogen and the palladium catalyst removed via filtration through 1.0 micron glass fiber and 0.2 micron PTFE filters. The solvent was removed in vacuo and the crude reaction mixture distilled under vacuum (6 Torr, 110° C.) to afford 10.9 g (87%) of methyl 3-(3,3,3-trifluoro-2-hydroxy-2-(trifluoromethyl)propyl)bicyclo[2.2.1]heptane-2-carboxylate (VI) as a colorless liquid (mixture of isomers, 1:1 ratio).

Preparation of 1,1,1,3,3,3-hexafluoro-2-((3-(2-hydroxypropan-2-yl)bicyclo[2.2.1]heptan2-yl)methyl)propan-2-ol (VII):

To a flame-dried, nitrogen-purged, 500 mL 3-neck roundbottom flask with 250 mL, pressure-equalized addition funnel and stirbar was added 38 mL of methyl magnesium bromide (114 mmol, 3.5 eq., 3 M in ethyl ether). A degassed solution of 10.9 g methyl 3-(3,3,3-trifluoro-2-hydroxy-2-(trifluoromethyl)propyl)bicyclo[2.2.1]heptane-2-carboxylate (VI) (32.6 mmol, 1 eq.) in 75 mL anhydrous tetrahydrofuran was charged to the addition funnel and added dropwise to the reaction over the course of 1 hour at room temperature. The reaction was stirred at room temperature for 14 hours, after which it was cooled to 0° C. and carefully quenched with dilute hydrochloric acid solution until the pH was less than 5.0. The reaction solution was neutralized with saturated aqueous sodium bicarbonate until the pH was greater than 8. The product was extracted into ethyl ether and the organic phase washed with brine and dried over magnesium sulfate, filtered, concentrated in vacuo, and stored over a small amount of sodium bicarbonate. Only 2 products (~1:1) were observed by $^{19}F$ NMR and the crude product (12.4 g) was carried on without further purification.

Preparation of 1,1,1,3,3,3-hexafluoro-2-((3-(2-hydroxypropan-2-yl)bicyclo[2.2.1]heptan-2-yl)methyl)propan-2-yl methacrylate (VIII):

To a flame-dried, nitrogen-purged 250 mL 3-neck roundbottom flask with 50 mL pressure-equalizing addition funnel and magnetic stirbar was charged 141 mL n-butyl lithium (65 mmol, 2 equiv., 1.6 M in hexanes). A degassed solution of 1,1,1,3,3,3-hexafluoro-2-((3-(2-hydroxypropan-2-yl)bicyclo[2.2.1]heptan-2-yl)methyl)propan-2-ol (VII) (~33 mmol, 1 eq.) in 50 mL anhydrous tetrahydrofuran was charged to the addition funnel was added to the reaction mixture dropwise at 0° C. over 30 minutes. The reaction mixture was warmed for 15 minutes on an oil bath at 70° C. to ensure the reaction was complete. The reaction vessel was cooled to 0° C. and 3.75 g methacryloyl chloride (36 mmol, 1.1 eq.) was added dropwise and allowed to stir for 15 minutes. The addition funnel was replaced with a reflux condenser and the reaction heated to reflux for 20 hours. After the reaction was complete, it was cooled to 0° C. and quenched with dilute HCl solution until the pH was less than 5.0. The reaction solution was neutralized with saturated aqueous sodium bicarbonate until the pH was greater than 8. The product was extracted into ethyl ether and the organic phase washed sequentially with aqueous sodium bicarbonate, water, and brine and then dried over magnesium sulfate, filtered, concentrated in vacuo, and stored over a small amount of sodium bicarbonate. The crude product mixture was purified via silica gel column chromatography (20:1 hexane:ethyl acetate eluent) to afford 4.0 g (30%) of 1,1,1,3,3,3-hexafluoro-2-((3-(2-hydroxypropan-2-yl)bicyclo[2.2.1]heptan-2-yl)methyl)propan-2-yl methacrylate (VIII) as a colorless liquid (~1.35:1 isomer ratio).

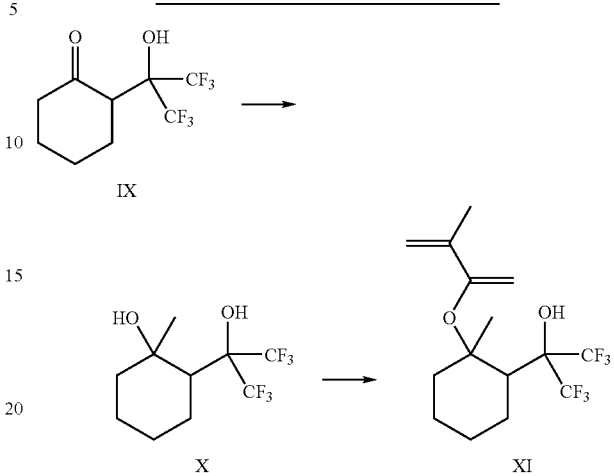

Scheme 2.
Synthesis of fluoroalcohol-functionalized protecting group and methacrylate monomer.

EXAMPLE 3

Synthesis of 2-(1,1,1,3,3,3-hexafluoro-2-hydroxypropan-2-yl)-1-methylcyclohex-1-yl methacrylate (XII)

Preparation of 2-(1,1,1,3,3,3-hexafluoro-2-hydroxypropan-2-yl)cyclohexanone (IX):

To a 1 L roundbottom flask with stirbar was added 22.9 g sodium iodide (152 mmol, 1.25 eq.). The vessel was flame-dried under vacuum to dehydrate the salt. After cooling to room temperature, 150 mL anhydrous acetonitrile was added and stirred until the NaI had dissolved. Anhydrous pentane (125 mL) was added via cannula followed by 12 g cyclohexanone (122 mmol, 1 eq.) and 16 g anhydrous triethylamine (159 mmol, 1.25 eq.). The vessel was cooled to 0 C and 16.5 g trimethylsilyl chloride (152 mmol, 1.25 eq.) was added via syringe. The reaction was stirred overnight at room temperature after which the acetonitrile layer was extracted into 2×250 mL anhydrous pentane. The combined pentane fractions were washed with ice cold ammonium chloride solution, dried over magnesium sulfate, filtered, and concentrated in vacuo to afford the crude trimethylsilyl enol ether, which was carried on without further purification.

To a flame-dried, nitrogen-purged 3-neck roundbottom flask with coldfinger condenser and stirbar was charged the crude trimethylsilyl enol ether of cyclohexanone. Hexafluoroacetone was condensed into a flask using dry ice and acetone in the coldfinger condenser while the reaction was kept at room temperature. Hexafluoroacetone was added as needed over the next 4 hours as aliquots of the reaction were monitored via NMR. Upon completion, the excess hexafluoroacetone was carefully vented through saturated potassium hydroxide solution and the solvent removed in vacuo. The crude product was dissolved in 100 mL methanol and the trimethylsilyl group removed with 8.43 g potassium carbonate (61 mmol, 0.5 eq.). After stirring for 2.5 hours, the reaction was acidified with dilute HCl solution until the pH reached 5.0. The product was extracted into ethyl ether and washed sequentially with aqueous sodium bicarbonate, water, and brine, dried over magnesium sulfate, filtered, and concentrated in vacuo. The crude product was distilled using a vacuum-jacketed short-path distillation hear (6 Torr, 110° C.) to afford 18.7 g (58%) of 2-(1,1,1,3,3,3-hexafluoro-2-hydroxypropan-2-yl)cyclohexanone (IX).

Preparation of 2-(1,1,1,3,3,3-hexafluoro-2-hydroxypropan-2-yl)-1-methylcyclohexanol (X)

To a flame-dried, nitrogen-purged, 250 mL 3-neck roundbottom flask with 50 mL, pressure-equalized addition funnel and stirbar was added 48 mL of methyl magnesium bromide (143 mmol, 2.1 eq., 3 M in ethyl ether). A degassed solution of 18 g methyl 2-(1,1,1,3,3,3-hexafluoro-2-hydroxypropan-2-yl) cyclohexanone (IX) (68 mmol, 1 eq.) in 60 mL anhydrous tetrahydrofuran was charged to the addition funnel and added dropwise to the reaction over the course of 1 hour at room temperature. The reaction was stirred at room temperature for 14 hours, after which it was cooled to 0° C. and carefully quenched with dilute hydrochloric acid solution until the pH was less than 5.0. The reaction solution was neutralized with saturated aqueous sodium bicarbonate until the pH was greater than 8. The product was extracted into ethyl ether and the organic phase washed with brine and dried over magnesium sulfate, filtered, concentrated in vacuo, and stored over a small amount of sodium bicarbonate. Crude $^1$H and $^{19}$F NMR indicated only 42% conversion to a single isomer. The reaction was repeated again and the conversion driven to 69% by NMR. The crude product was taken on to the next step without further purification.

Preparation of 2-(1,1,1,3,3,3-hexafluoro-2-hydroxypropan-2-yl)-1-methylcyclohex-1-yl methacrylate (XII):

To a flame-dried, nitrogen-purged 250 mL 3-neck roundbottom flask with 50 mL pressure-equalizing addition funnel and magnetic stirbar was charged 85 mL n-butyl lithium (136 mmol, 2 equiv., 1.6 M in hexanes). A degassed solution of 12-(1,1,1,3,3,3-hexafluoro-2-hydroxypropan2-yl)-1-methylcyclohexanol (X) (~68 mmol, 1 eq.) in 50 mL anhydrous tetrahydrofuran was charged to the addition funnel and added to the reaction mixture dropwise at 0° C. over 30 minutes. The reaction mixture was warmed for 15 minutes on a hot water bath to ensure the reaction was complete. The reaction vessel was cooled to 0° C. and 7.46 g methacryloyl chloride (71.4 mmol, 1.05 eq.) was added dropwise and allowed to stir for 15 minutes. The addition funnel was replaced with a reflux condenser and the reaction heated to reflux for 20 hours. After the reaction was complete, it was cooled to 0° C. and quenched with dilute HCl solution until the pH was less than 5.0. The reaction solution was neutralized with saturated aqueous sodium bicarbonate until the pH was greater than 8. The product was extracted into ethyl ether and the organic phase washed sequentially with aqueous sodium bicarbonate, water, and brine and then dried over magnesium sulfate, filtered, concentrated in vacuo, and stored over a small amount of sodium bicarbonate. The crude product mixture was purified via silica gel column chromatography (20:1 hexane:ethyl acetate eluent) to afford 3.08 of 2-(1,1,1,3,3,3-hexafluoro-2-hydroxypropan-2-yl)-1-methylcyclohex-1-yl methacrylate (XII) as a colorless liquid (1 isomer) of only 66% purity. After standing in the refrigerator overnight, 2-(1,1,1,3,3,3-hexafluoro-2-hydroxypropan-2-yl)-1-methylcyclohex-1-yl methacrylate (XII) crystallizes out of the mixture a white crystalline solid.

EXAMPLE 4

Synthesis of 2-methylhexan-2-yl methacrylate (XIII)

To a flame-dried, nitrogen-purged 500 mL 3-neck roundbottom flask with 250 mL pressure-equalizing addition funnel and magnetic stirbar was charged 81 mL n-butyl lithium (129 mmol, 1 equiv., 1.6 M in hexanes). A degassed solution of 15.0 g 2-methyl-2-hexanol (129 mmol, 1 eq.) in 100 mL anhydrous tetrahydrofuran was charged to the addition funnel and added to the reaction mixture dropwise at 0° C. over 60 minutes. The reaction mixture was warmed for 15 minutes on hot water bath to ensure the reaction was complete. The reaction vessel was cooled to 0° C. and 14.2 g methacryloyl chloride (135 mmol, 1.05 eq.) was added dropwise and allowed to stir for 15 minutes. The addition funnel was replaced with a reflux condenser and the reaction heated to reflux for 20 hours. After the reaction was complete, it was cooled to 0° C. and quenched aqueous sodium bicarbonate. The product was extracted into ethyl ether and the organic phase washed sequentially with aqueous sodium bicarbonate, water, and brine and then dried over magnesium sulfate, filtered, concentrated in vacuo, and stored over a small amount of sodium bicarbonate. The crude product mixture was vacuum distilled through a vacuum-jacketed short-path distillation head to afford 14 g (59%) of 2-methylhexan-2-yl methacrylate (XIII) as a colorless liquid.

EXAMPLE 5

Synthesis of a Homopolymer of 1,1,1-trifluoro-2-trifluoromethyl-2-hydroxy-6-methyl-heptan-6-yl methacrylate Poly(IV)

1,1,1-trifluoro-2-trifluoromethyl-2-hydroxy-6-methyl-heptan-6-yl methacrylate (IV) (2.5 g, 7.4 mmol, 1 eq.), 1-dodecanethiol (0.045 g, 0.22 mmol, 0.03 eq.), and 2,2'-azobisisobutyronitrile (AIBN) (0.049 g, 0.30 mmol, 0.04 eq.) were added to a 100 mL roundbottom flask with reflux condenser and dissolved in 5 mL of inhibitor-free tetrahydrofuran. The solution was degassed via 3 sequential pump-backfill cycles with nitrogen. The reaction was then heated to reflux for 21 hours. The solution was added dropwise to 500 mL of hexanes and the precipitated polymer was subsequently isolated on a filter frit, washed twice with hexanes, and dried under vacuum at 40° C. overnight. Yield: 1.49 g (60%).

EXAMPLE 6

Synthesis of a Copolymer of 1,1,1-trifluoro-2-trifluoromethyl-2-hydroxy-6-methyl-hept-6-yl methacrylate and hydroxyadamantyl methacrylate: Poly(IV-co-HAdMa)

1,1,1-trifluoro-2-trifluoromethyl-2-hydroxy-6-methyl-hept-6-yl methacrylate (IV) (2.0 g, 7.4 mmol, 0.4 eq.), hydroxyadamantyl methacrylate (HAdMa) (2.10 g, 8.9 mmol, 0.6 eq.), 1-dodecanethiol (0.090 g, 0.45 mmol, 0.03 eq.), and 2,2'-azobisisobutyronitrile (AIBN) (0.098 g, 0.59 mmol, 0.04 eq.) were added to a 100 mL roundbottom flask with reflux condenser and dissolved in 10 mL of inhibitor-free tetrahydrofuran. The solution was degassed via 3 sequential pump-backfill cycles with nitrogen. The reaction was then heated to reflux for 23 hours. The solution was added dropwise to 500 mL of hexanes and the precipitated polymer was subsequently isolated on a filter frit, washed twice with hexanes, and dried under vacuum at 60° C. overnight. Yield: 3.95 g (96%).

EXAMPLE 7

Synthesis of a Copolymer of 1,1,1-trifluoro-2-trifluoromethyl-2-hydroxy-6-methyl-hept-6-yl methacrylate and 4-oxa-tricyclo[4.2.1.0$^{3,7}$]non-5-one-2yl methacrylate: Poly(IV-co-NLM)

1,1,1-trifluoro-2-trifluoromethyl-2-hydroxy-6-methyl-hept-6-yl methacrylate (IV) (2.0 g, 5.9 mmol, 0.4 eq.), 4-oxa-tricyclo[4.2.1.0$^{3,7}$]non-5-one-2yl (NLM) (1.98 g, 8.9 mmol, 0.6 eq.), 1-dodecanethiol (0.090 g, 0.45 mmol, 0.03 eq.), and 2,2'-azobisisobutyronitrile (AIBN) (0.098 g, 0.59 mmol, 0.04 eq.) were added to a 100 mL roundbottom flask with reflux condenser and dissolved in 10 mL of inhibitor-free tetrahydrofuran. The solution was degassed via 3 sequential pump-backfill cycles with nitrogen. The reaction was then heated to reflux for 21 hours. The solution was added dropwise to 500 mL of hexanes and the precipitated polymer was subsequently isolated on a filter frit, washed twice with hexanes, and dried under vacuum at 60° C. overnight. Yield: 3.75 g (94%).

EXAMPLE 8

Synthesis of a Copolymer of 1,1,1-trifluoro-2-trifluoromethyl-2-hydroxy-6-methyl-hept-6-yl-methacrylate and 5-(3,3,3-trifluoro-2-hydroxy-2-(trifluoromethyl)propyl)bicyclo[2.2.1]heptanyl methacrylate Poly(IV-co-NBHFA-Ma)

1,1,1-trifluoro-2-trifluoromethyl-2-hydroxy-6-methyl-hept-6-yl methacrylate (IV) (2.0 g, 7.4 mmol, 0.4 eq.), 5-(3,3,3-trifluoro-2-hydroxy-2-(trifluoromethyl)propyl)bicyclo[2.2.1]heptanyl methacrylate (NBHFA-Ma) (3.19 g, 8.9 mmol, 0.6 eq.), 1-dodecanethiol (0.090 g, 0.45 mmol, 0.03 eq.), and 2,2'-azobisisobutyronitrile (AIBN) (0.098 g, 0.59 mmol, 0.04 eq.) were added to a 100 mL roundbottom flask with reflux condenser and dissolved in 10 mL of inhibitor-free tetrahydrofuran. The solution was degassed via 3 sequential pump-backfill cycles with nitrogen. The reaction was then heated to reflux for 23 hours. The solution was added dropwise to 500 mL of hexanes and the precipitated polymer was subsequently isolated on a filter frit, washed twice with hexanes, and dried under vacuum at 60° C. overnight. Yield: 4.04 g (78%).

EXAMPLE 9

Synthesis of a Terpolymer of 1,1,1-trifluoro-2-trifluoromethyl-2-hydroxy-6-methyl-hept-6-yl methacrylate, 5-(3,3,3-trifluoro-2-hydroxy-2-(trifluoromethyl)propyl)bicyclo[2.2.1]heptanyl methacrylate, and 4-oxa-tricyclo[4.2.1.0$^{3,7}$]non-5-one-2yl methacrylate Poly(IV-co-NBHFA-Ma-co-NLM)

1,1,1-trifluoro-2-trifluoromethyl-2-hydroxy-6-methyl-hept-6-yl methacrylate (IV) (1.0 g, 3.0 mmol, 0.45 eq.), 5-(3,3,3-trifluoro-2-hydroxy-2-(trifluoromethyl)propyl)bicyclo[2.2.1]heptanyl methacrylate (NBHFA-Ma) (0.36 g, 0.99 mmol, 0.15 eq.), (NLM) (0.59 g, 2.6 mmol, 0.40 eq.), 1-dodecanethiol (0.040 g, 0.20 mmol, 0.03 eq.), and 2,2'-azobisisobutyronitrile (AIBN) (0.043 g, 0.26 mmol, 0.04 eq.) were added to a 100 mL roundbottom flask with reflux condenser and dissolved in 8 mL of inhibitor-free tetrahydrofuran. The solution was degassed via 3 sequential pump-backfill cycles with nitrogen. The reaction was then heated to reflux for 23 hours. The solution was added dropwise to 500 mL of hexanes and the precipitated polymer was subsequently isolated on a filter frit, washed twice with hexanes, and dried under vacuum at 60° C. overnight. Yield: 1.55 g (79%).

COMPARATIVE EXAMPLE 10

Synthesis of a copolymer of 2-methylhexan-2-yl methacrylate and 5-(3,3,3-trifluoro-2-hydroxy-2-(trifluoromethyl)propyl)bicyclo[2.2.1]heptanyl methacrylate Poly(XIII-co-NBHFA-Ma)

12-Methylhexan-2-yl methacrylate (XII) (0.5 g, 2.7 mmol, 0.4 eq.), 5-(3,3,3-trifluoro-2-hydroxy-2-(trifluoromethyl)propyl)bicyclo[2.2.1]heptanyl methacrylate (NBHFA-Ma) (1.47 g, 4.1 mmol, 0.6 eq.), 1-dodecanethiol (0.041 g, 0.20 mmol, 0.03 eq.), and 2,2'-azobisisobutyronitrile (AIBN) (0.045 g, 0.27 mmol, 0.04 eq.) were added to a 100 mL roundbottom flask with reflux condenser and dissolved in 7 mL of inhibitor-free tetrahydrofuran. The solution was degassed via 3 sequential pump-backfill cycles with nitrogen. The reaction was then heated to reflux for 18 hours. The solution was added dropwise to 500 mL of hexanes and the precipitated polymer was subsequently isolated on a filter frit, washed twice with hexanes, and dried under vacuum at 80° C. overnight. Yield: 1.18 g (60%).

COMPARATIVE EXAMPLE 11

Synthesis of a terpolymer of 2-methylhexan-2-yl methacrylate, 5-(3,3,3-trifluoro-2-hydroxy-2-(trifluoromethyl)propyl)bicyclo[2.2.1]heptanyl methacrylate, and 4-oxa-tricyclo[4.2.1.0$^{3,7}$]non-5-one-2yl methacrylate: Poly(XIII-co-NBHFA-Ma-co-NLM)

2-Methylhexan-2-yl methacrylate (XII) (0.6 g, 3.3 mmol, 0.45 eq.), 5-(3,3,3-trifluoro-2-hydroxy-2-(trifluoromethyl)propyl)bicyclo[2.2.1]heptanyl methacrylate (NBHFA-Ma) (0.39 g, 1.1 mmol, 0.15 eq.), (NLM) (0.64 g, 2.9 mmol, 0.40 eq.), 1-dodecanethiol (0.044 g, 0.22 mmol, 0.03 eq.), and 2,2'-azobisisobutyronitrile (AIBN) (0.048 g, 0.29 mmol, 0.04 eq.) were added to a 100 mL roundbottom flask with reflux condenser and dissolved in 7 mL of inhibitor-free tetrahydrofuran. The solution was degassed via 3 sequential pump-backfill cycles with nitrogen. The reaction was then heated to reflux for 18 hours. The solution was added dropwise to 500 mL of hexanes and the precipitated polymer was subsequently isolated on a filter frit, washed twice with hexanes, and dried under vacuum at 80° C. overnight. Yield: 1.37 g (84%).

EXAMPLES 12-27

Lithographic imaging: General procedures.

Resists were formulated as 12 wt % solids in propylene glycol methyl ether acetate (PGMEA) or PGMEA/gamma-butyrolactone (85:15 by wt, respectively). The solids content consisted of resist polymer plus 4-butoxynaphth-1-yl tetramethylenesulfonium nonaflate photoacid generator (5 wt %) and 2-phenyl benzimidazole quencher (0.34 wt %). The solutions were filtered through a 0.2 micron PTFE filter prior to spin-casting onto a silicon wafers (which had been previously coated with Rohm & Haas AR24 anti-reflective coating) at 3000 rpm for 60 seconds. The film was subjected to a post-application bake of 130° C. for 60 seconds. Exposure was performed on an Ultratech 193 nm ministepper (0.6 NA) with a binary (chrome on glass) mask. The post-exposure bake was performed on a thermal gradient hotplate for 60 seconds. Development was performed using Rohm & Haas LDD-26W developer for 60 seconds. Thickness measurements were obtained using a NanoSpec 6100 (Nanometrics). Contrast curves were obtained using a thermal gradient plate as described in Larson et al., Proc. SPIE 5376, 1165-1173.

EXAMPLE 12

Contrast curve for Poly(IV) is shown in FIG. 1. Good contrast is obtained at low post-exposure bake temperatures down to 60° C. as seen in FIG. 1. This is in stark contrast to resists formulated with less fluoroalcohol (see Examples 13 and 14) where much higher PEB temperatures are required. This homopolymer, while capable of serving as a high photospeed resist, suffers from moderate dark loss which can be remedied through copolymerization with appropriate comonomers (see Examples 18 and 19).

EXAMPLE 13

Figure 2:
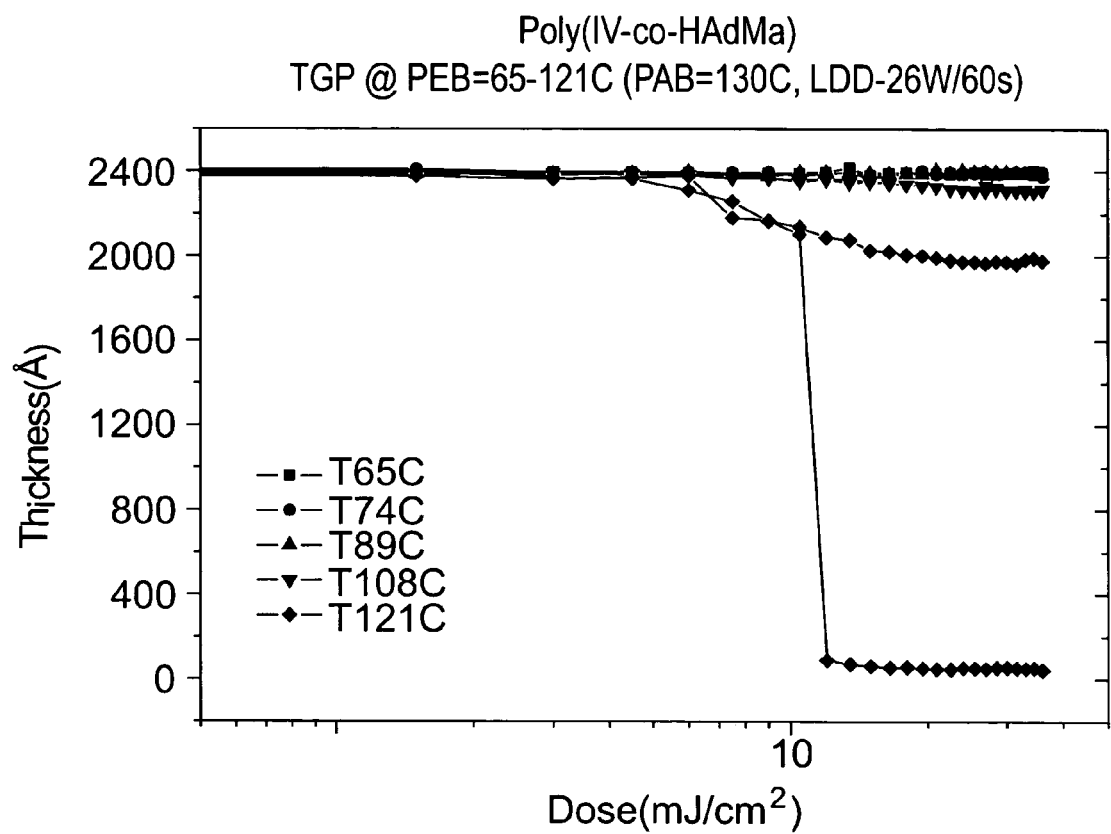
FIG. 2 is a contrast curve for photoresist polymers used in the present invention.

Contrast curve for Poly(IV-co-HAdMa) is shown in FIG. 2. Note high PEB temperatures required due to less polar HAdMa groups. While no dark loss is evident, photospeed is decreased.

EXAMPLE 14

Figure 3:
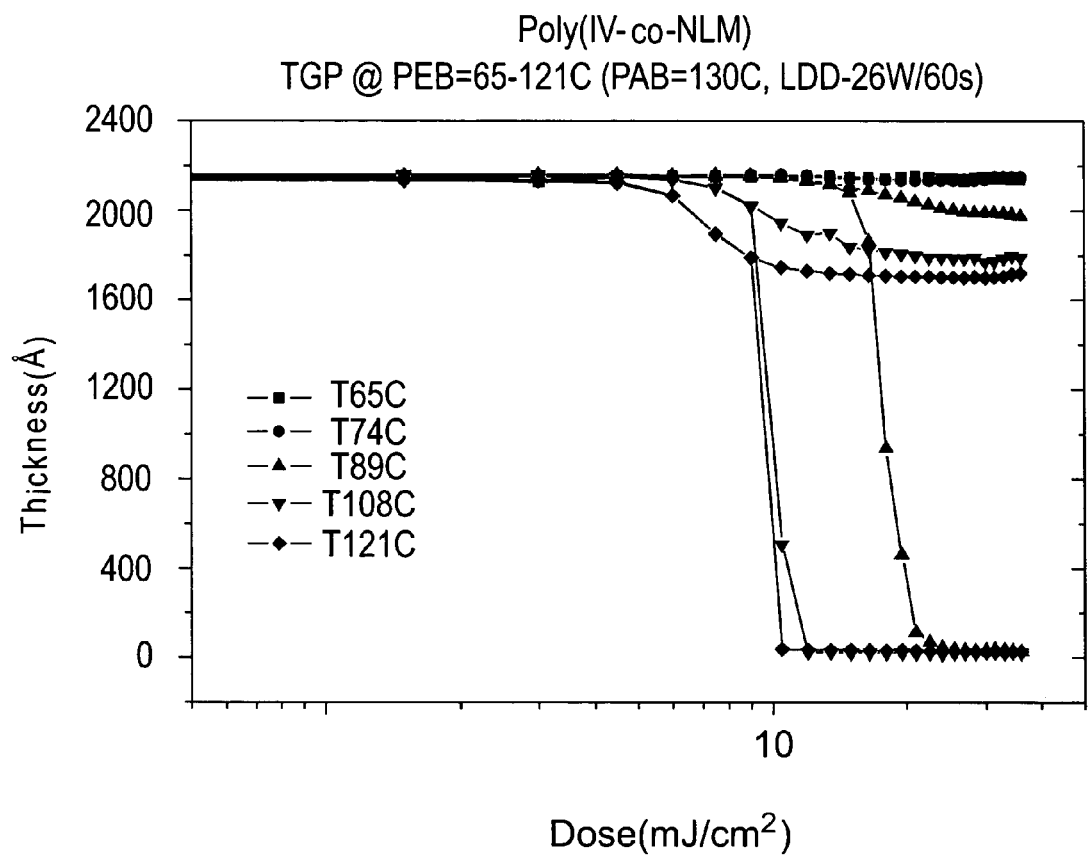
FIG. 3 is a contrast curve film for photoresist polymers used in the present invention.

Contrast curve for Poly(IV-co-NLM) is shown in FIG. 3. Incorporation of NLM raises PEB temperatures and decreases photospeed while eliminating dark loss.

EXAMPLE 15

Figure 4:
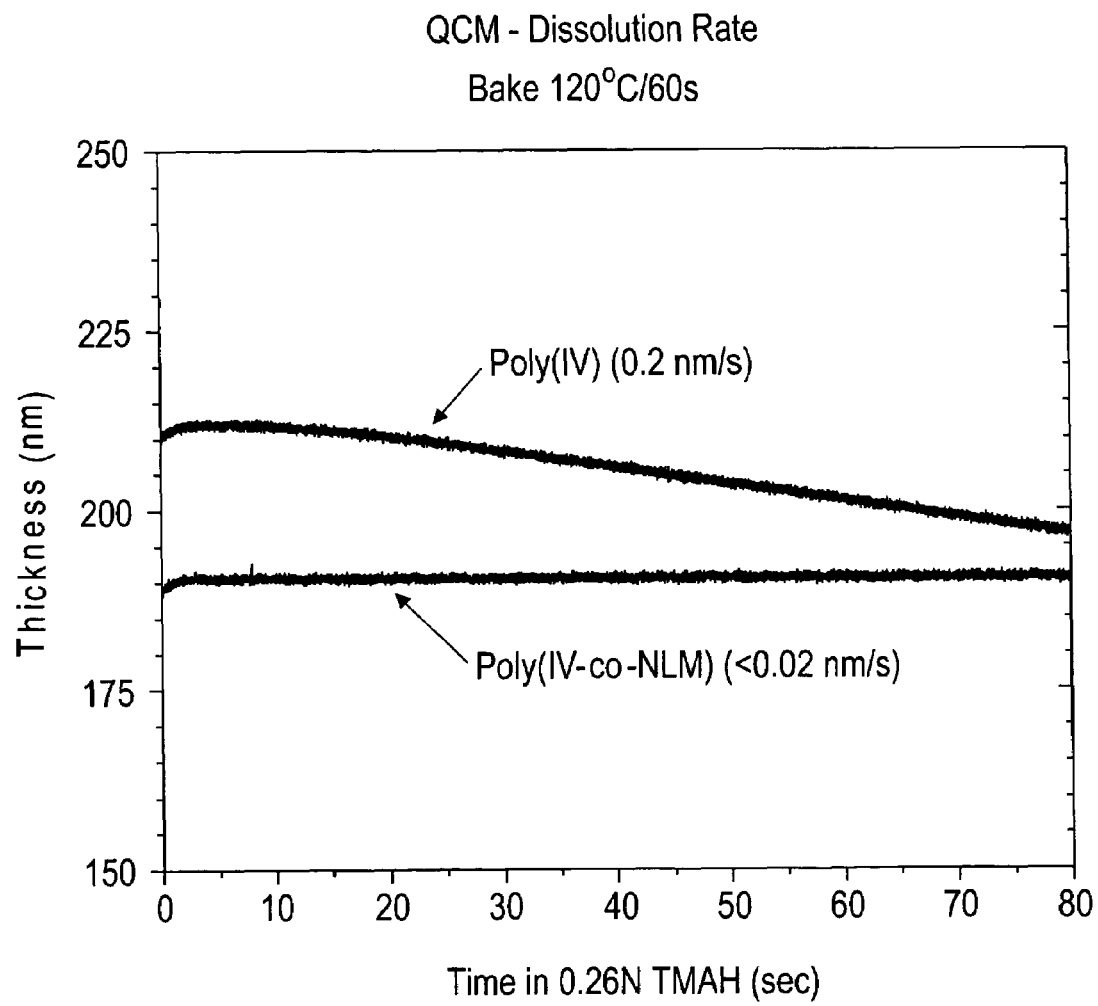
FIG. 4 is a graph showing dissolution rates of polymers used in the present invention.

Dissolution measurements of Poly(IV) and Poly(IV-co-NLM) are shown in FIG. 4. Dissolution rate of Poly(IV) is consistent with observed dark loss in Example 12.

EXAMPLE 16

Figure 5:
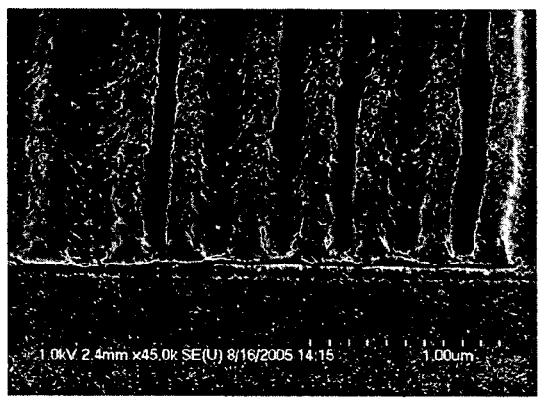
FIG. 5 are photographs of resist images created by the method of the present invention.
Figure 5:
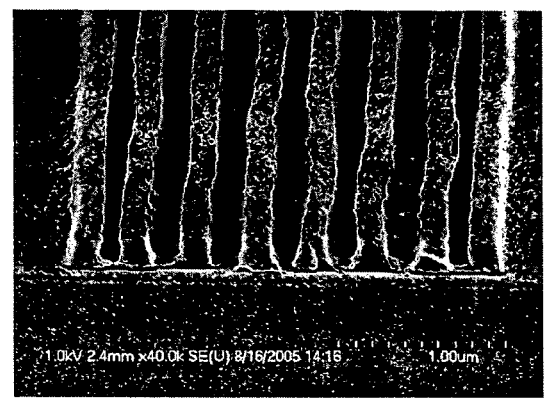

Lithographic image of Poly(IV-co-HAdMa) is shown in FIG. 5.

EXAMPLE 17

Figure 6:
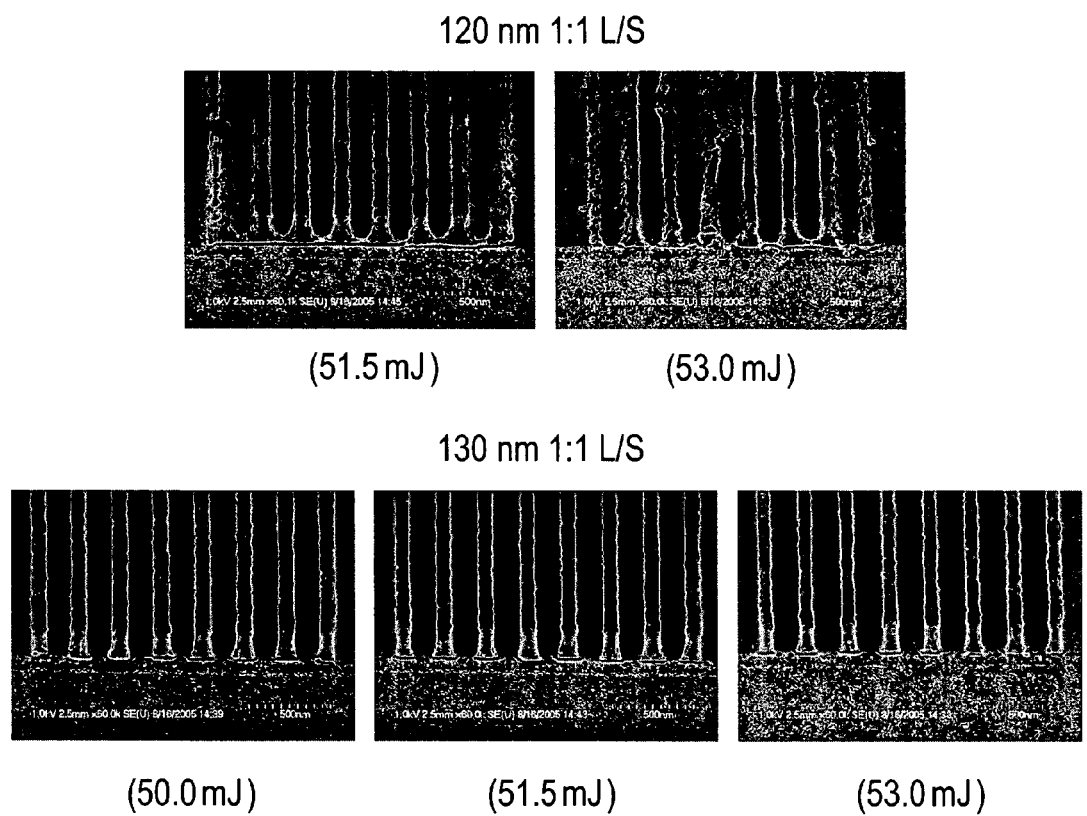
FIG. 6 are photographs of resist images created by the method of the present invention.

Lithographic image of Poly(IV-co-NLM) is shown in FIG. 6.

EXAMPLE 18

Figure 7:
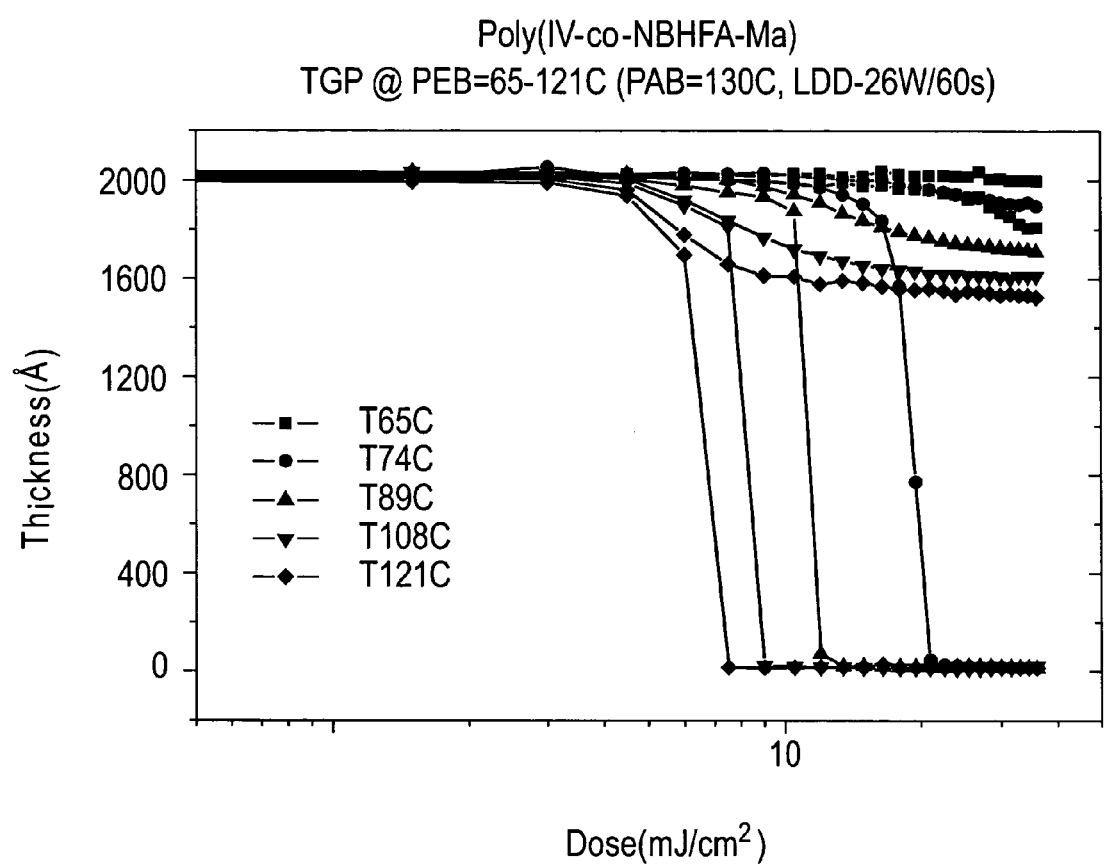
FIG. 7 is a contrast curve for photoresist polymers used in the present invention.

Contrast curve for Poly(IV-co-NBHFA-Ma) is shown in FIG. 7. Incorporation of NBHFA-Ma results in slight increase in PEB and slight decrease in photospeed, but eliminates dark loss.

EXAMPLE 19

Figure 8:
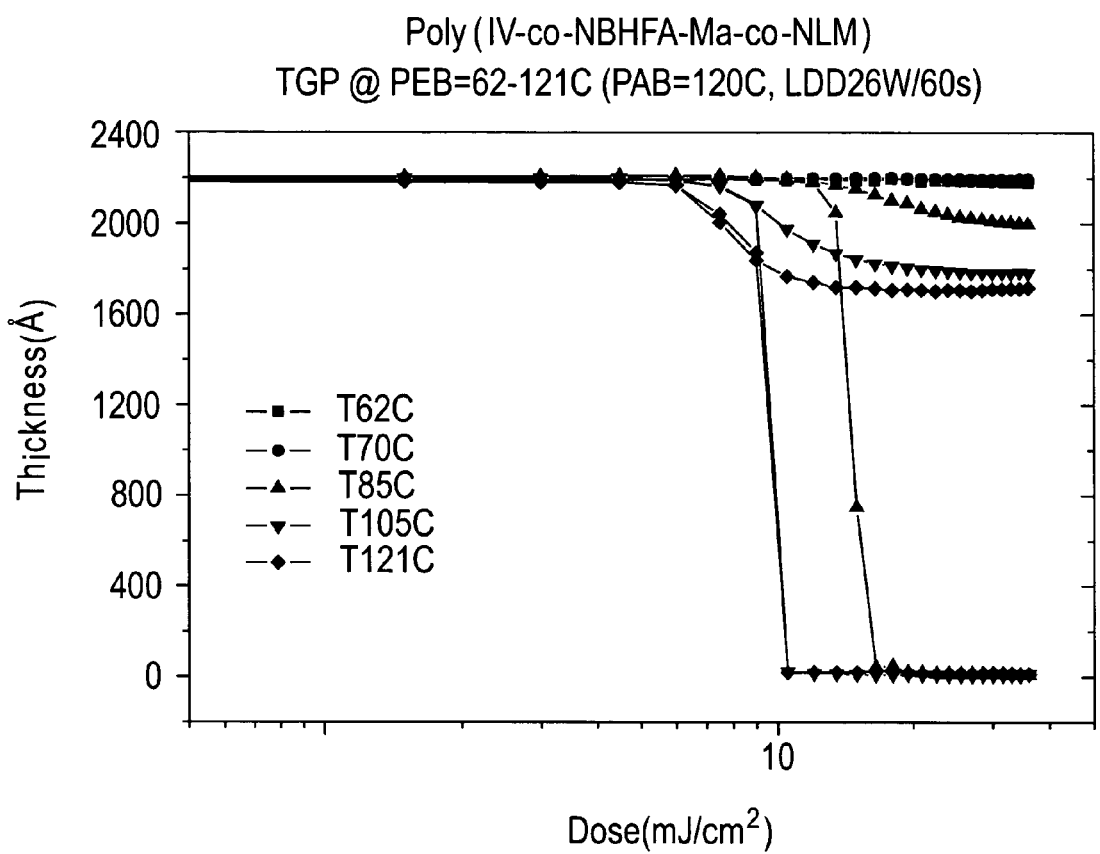
FIG. 8 is a contrast curve for photoresist polymers used in the present invention.

Contrast curve for Poly(IV-co-NBHFA-Ma-co-NLM) is shown in FIG. 8. Terpolymerization again results in slight increase in PEB and slight decrease in photospeed, but results in very high contrast.

EXAMPLES 20 AND 21

Figure 9:
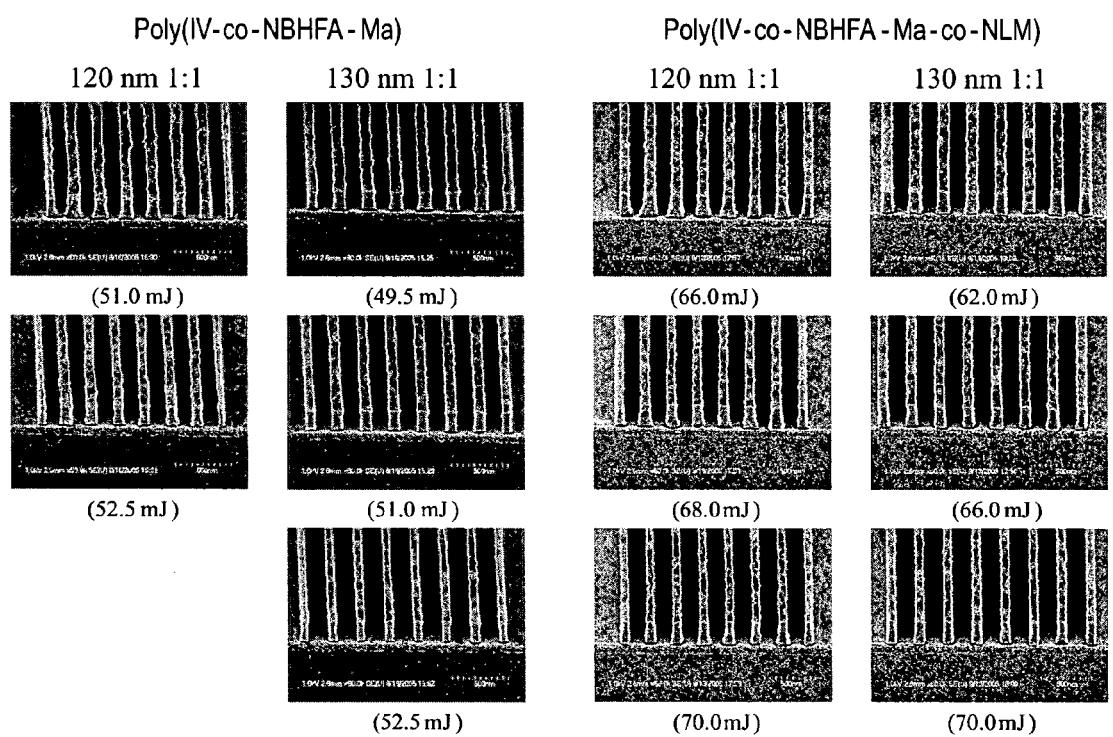
FIG. 9 shows photographs of resist images created by the method of the present invention.

Lithographic images of Poly(IV-co-NBHFA-Ma) and Poly(IV-co-NBHFA-Ma-co-NLM) is shown in FIG. 9. 120 nm images can be obtained with good sidewall profiles and good clearing of the resist at the bottom of the channels.

EXAMPLE 22

Figure 10:
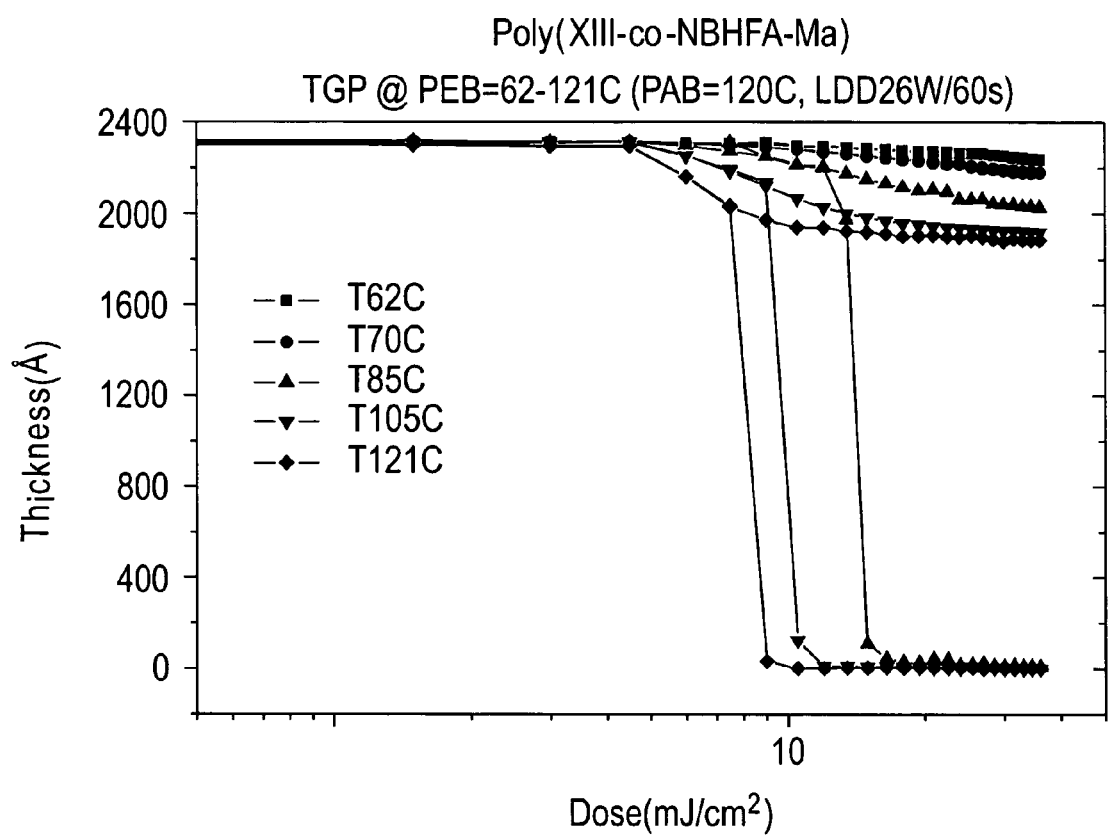
FIG. 10 is a contrast curve for photoresist polymers used in the present invention.

Contrast curve for comparative example Poly(XIII-co-NB-HFA-Ma) is shown in FIG. 10. This compares to example 18 with a non-functionalized tertiary ester solubility switch. Note higher PEBs and lower photospeeds.

EXAMPLE 23

Figure 11:
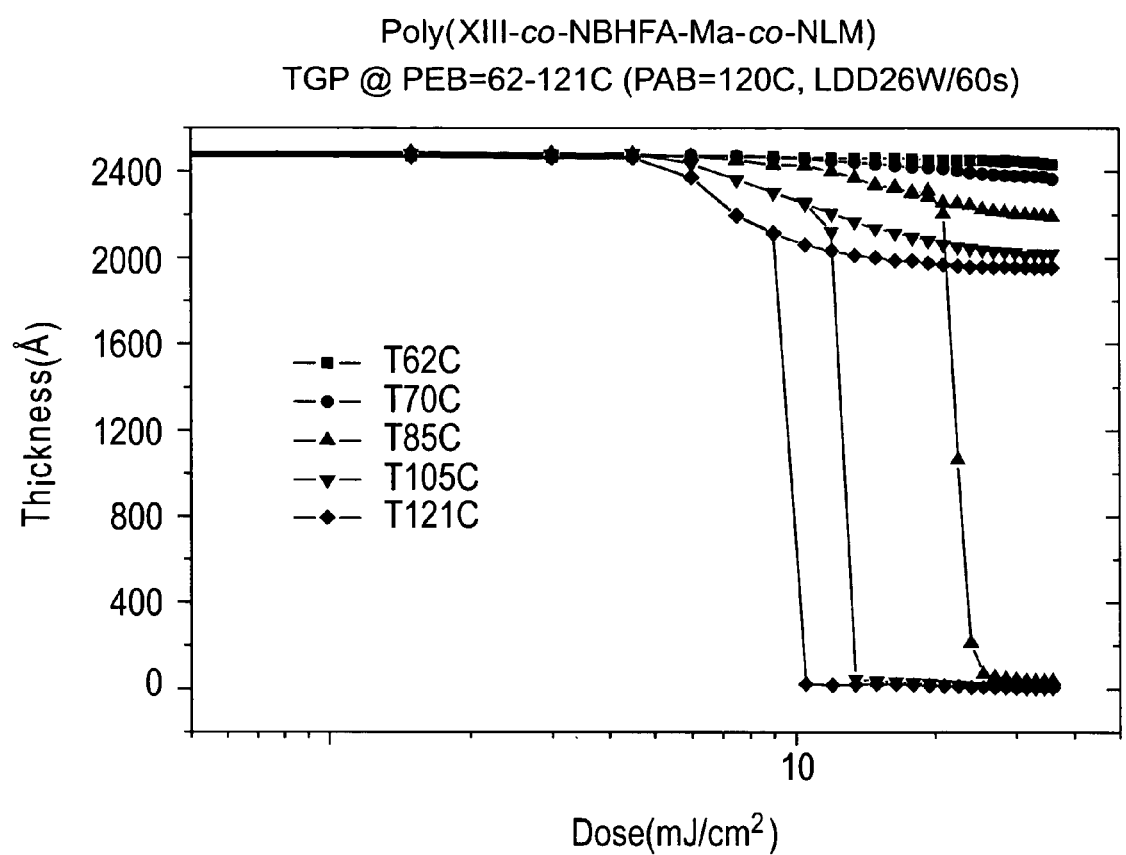
FIG. 11 is a contrast curve for photoresist polymers used in the present invention.

Contrast curve for comparative example Poly(XIII-co-NB-HFA-Ma-co-NLM) is shown in FIG. 11. This compares to example 19 with a non-functionalized tertiary ester solubility switch. Note higher PEBs, lower photospeeds.

EXAMPLES 24 AND 25

Figure 12:
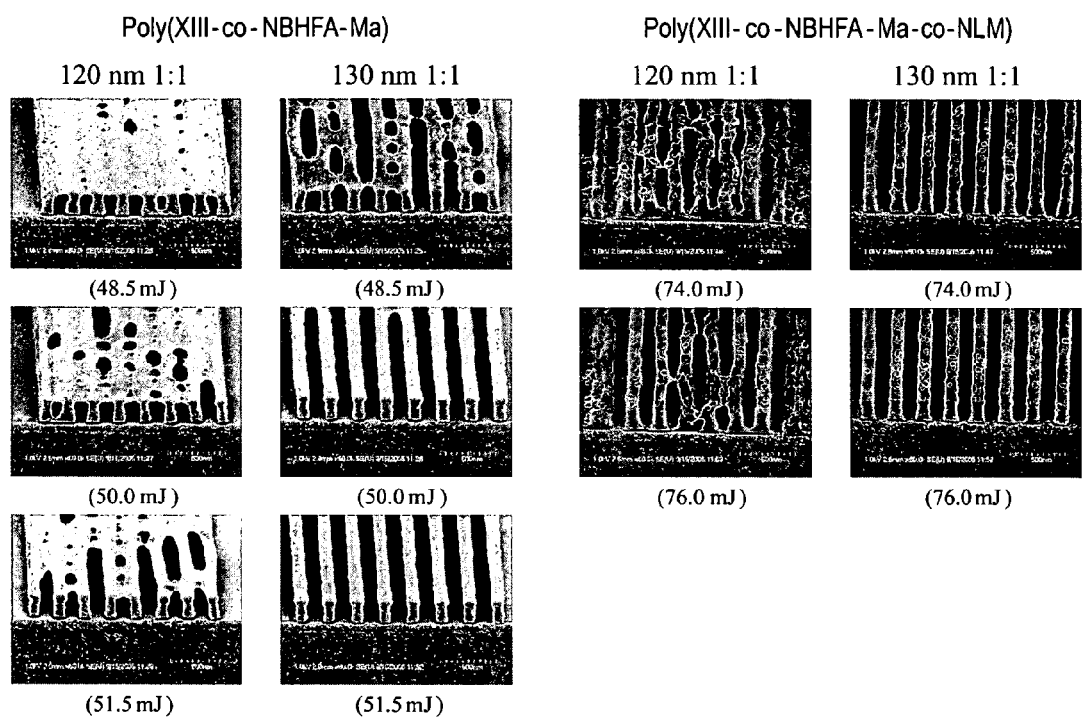
FIG. 12 shows photographs of resist images created by the method of the present invention.

Lithographic imaging of comparative examples Poly(XIII-co-NBHFA-Ma) and Poly(XIII-co-NBHFA-Ma-co-NLM) is shown in FIG. 12. These compare to examples 20 and 21 with a non-functionalized tertiary ester solubility switch. Note environmental sensitivity and line collapse.

EXAMPLE 26

Figure 13:
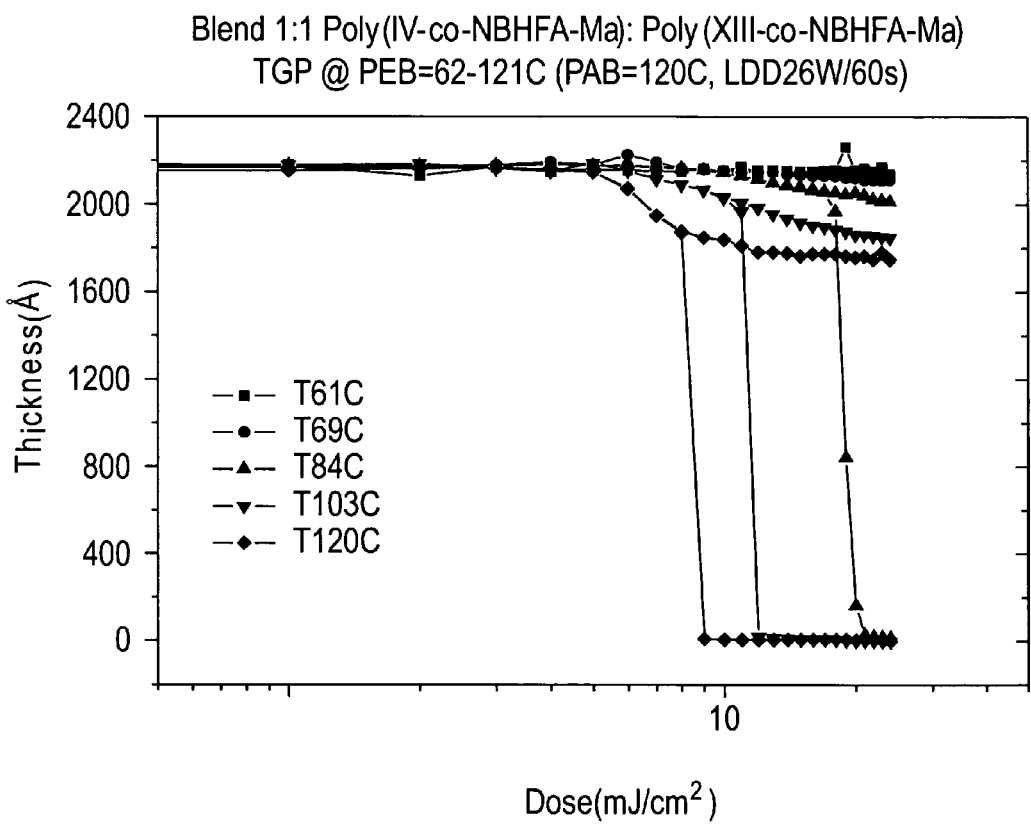
FIG. 13 is a contrast curve for photoresist polymers used in the present invention.

Contrast curve for a 1:1 blend of Poly(IV-co-NBHFA-Ma) and Poly(XIII-co-NBHFA-Ma) is shown in FIG. 13. Note slightly slower photospeed, slightly higher PEB, and slightly increased contrast.

EXAMPLE 27

Figure 14:
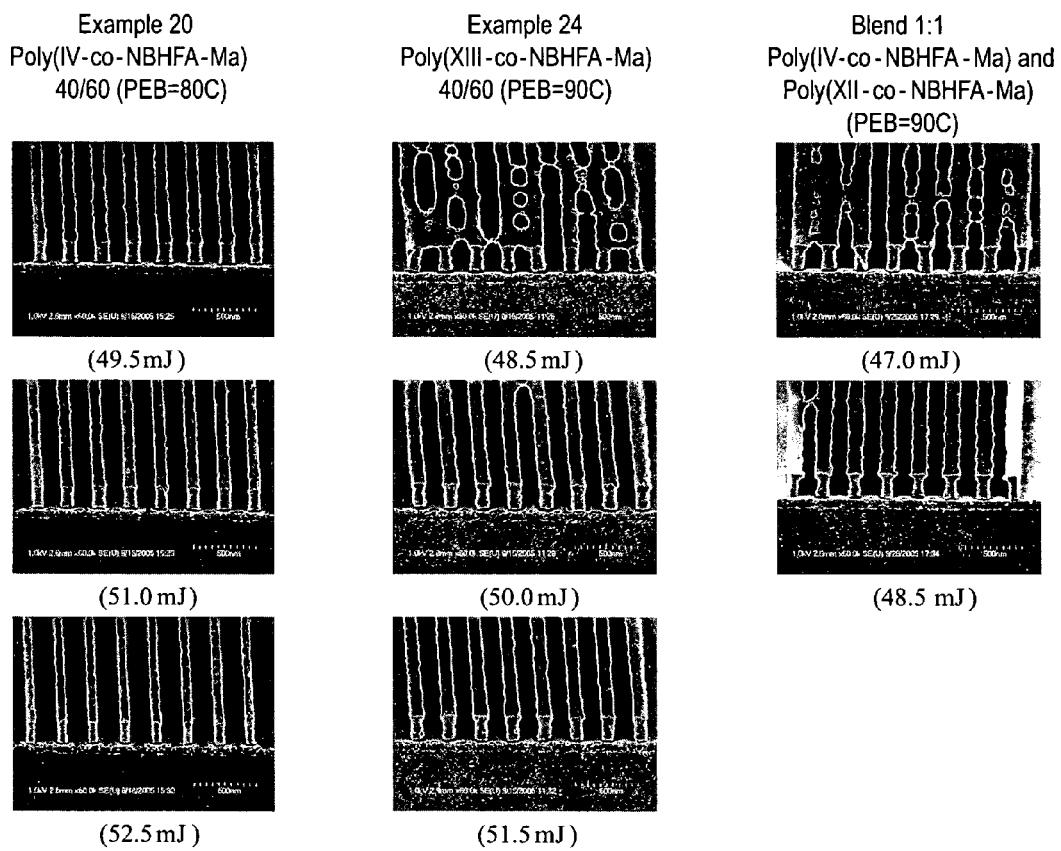
FIG. 14 are photographs of resist images created by the method of the present invention.

Lithographic imaging of a 1:1 blend of Poly(IV-co-NB-HFA-Ma) and Poly(XIII-co-NBHFA-Ma) is shown in FIG. 14. Good profiles but increased T-topping (characteristic of the Poly(XIII-co-NBHFA-Ma).

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Although this invention has been described with respect to specific embodiments, the details thereof are not to be construed as limitations, for it will be apparent that various embodiments, changes and modifications may be resorted to without departing from the spirit and scope thereof and it is understood that such equivalent embodiments are intended to be included within the scope of this invention.

What is claimed is:

1. A method for generating a photoresist image on a substrate comprising:
   (a) coating the substrate with a photoresist film;
   (b) coating the film with a terpolymer consisting essentially of the three monomer: (i) 1,1,1-trifluoro-2-trifluoromethyl-2-hydroxy-6-methyl-hept-6-yl-methacrylate,
(ii) 5-(3,3,3-trifluoro-2-hydroxy-2-(trifluoromethyl)propyl)bicyclo[2.2.1]heptanyl methacrylate, and (iii) 4-oxa-tricyclo[4.2.1.0$^{3,7}$] non-5-one-2yl methacrylate;

(c) imagewise exposing the film to radiation while a liquid is disposed on the film;

(d) heating the film; and (e) developing the image to the substrate.

2. A method for generating a photoresist image on a substrate comprising:

(a) coating the substrate with a photoresist film;

(b) coating the film with a protective macromolecule or a polymer comprising a monomer, wherein the macromolecule and the monomer each have the formula:

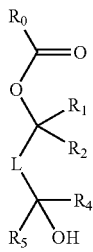

where $R_0$ is selected from a molecular glass, $C_{2-20}$ alkylenyl and fluorinated alkylenyl, and $C_{4-40}$ cycloalkylenyl and fluorinated cycloalkylenyl, each optionally substituted with one or more heteroatoms; $R_1$ and $R_2$ are independently selected from $C_{1-20}$ alkyl and further $R_1$ and $R_2$ can be bonded together to form a cyclic group;

L is a divalent $C_{1-20}$ alkyleneyl optionally substituted with one more substituents selected from $C_{1-20}$ alkyl and fluoroalkyl and $C_{4-30}$ cycloalkyl optionally substituted with a substituent selected from one or more fluoro and heteroatom substituents;

$R_4$ is selected from hydrido, trifluoromethyl, difluoromethyl, fluoromethyl, $C_{1-20}$ alkyl, and $C_{4-20}$ cycloalkyl each optionally substituted with one or more fluoro substituents; and $R_5$ is selected from trifluoromethyl, difluoromethyl, fluoromethyl, $C_{1-20}$ alkyl, and $C_{4-20}$ cycloalkyl each substituted with one or more fluoro substituents and further $R_4$ and $R_5$ can be linked to form a cyclic group;

(c) imagewise exposing the film and polymer to radiation;

(d) heating the film and polymer to a temperature at or below about 90° C.; and (e) developing the image to the substrate.

3. The method of claim 2, where $R_0$ has the formula:

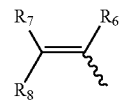

where $R_6$, $R_7$ and $R_8$ are independently select from hydrido, fluoro, and $C_{1-4}$ alkyl.

4. The method of claim 2, where $R_0$ has the formula:

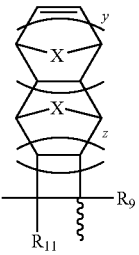

where $R_9$ is selected from hydrido, fluoro or $C_{1-20}$ alkyl optionally substituted with one or more fluoro substituents;

$R_{10}$ and $R_{11}$ are independently selected from hydrido, fluoro, and $C_{1-20}$ alkyl;

each X is a divalent substituent independently selected from carbonyl, oxygen, sulfur, methylene, ethylene, $>C(R_{12})(R_{13})$, $>C=CHR_{12}$, $>C=C(R_{12})(R_{13},)$, and $>NR$ where R, $R_{,2}$ and $R_{13}$ are independently selected from hydrido, fluoro, and $C_{1-20}$ alkyl optionally substituted with fluoro and where $R_{12}$ and $R_{13}$ can be linked to form a cyclic group; and where y is 0 to 4 and where z is 0 or 1.

5. The method of claim 2, where a liquid is disposed on the film during step (c) and the liquid has a refractive index of about 1.40 or more.

6. The method of claim 2, where L is selected from propylene and —$CHR_{14}$—$CHR_{15}$—$CH_2$—$CH_2$— where $R_{14}$ and $R_{15}$ are independently selected from $C_{1-20}$ alkyl optionally substituted with one or more fluoro substituents and where $R_2$ and $R_{14}$ can be linked to form a cyclic group and where $R_{14}$ and $R_{15}$ can be linked to form a cyclic group.

7. The method of claim 2, where L is $>CHR_{16}$ and where $R_{16}$ is $C_{1-20}$ alkyl optionally substituted with one or more fluoro substituents and where $R_{16}$ can be linked with $R_2$ to form a cyclic group.

8. The method of claim 2, where the film and polymer of step (d) are heated to a temperature at or below 80° C.

* * * * *